(12) United States Patent
Lee et al.

(10) Patent No.: US 12,002,698 B2
(45) Date of Patent: Jun. 4, 2024

(54) METROLOGY APPARATUS AND METHOD BASED ON DIFFRACTION USING OBLIQUE ILLUMINATION AND METHOD OF MANUFACTURING SEMICONDUCTOR DEVICE USING THE METROLOGY METHOD

(71) Applicant: SAMSUNG ELECTRONICS CO., LTD., Suwon-si (KR)

(72) Inventors: Myungjun Lee, Seongnam-si (KR); Changhyeong Yoon, Hwaseong-si (KR); Wookrae Kim, Suwon-si (KR); Jaehwang Jung, Suwon-si (KR); Jinseob Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 581 days.

(21) Appl. No.: 17/174,731

(22) Filed: Feb. 12, 2021

(65) Prior Publication Data

US 2022/0005715 A1    Jan. 6, 2022

(30) Foreign Application Priority Data

Jul. 6, 2020    (KR) ........................ 10-2020-0083129

(51) Int. Cl.
*H01L 21/67*    (2006.01)
*G01N 21/47*    (2006.01)
(Continued)

(52) U.S. Cl.
CPC ... *H01L 21/67288* (2013.01); *G01N 21/4788* (2013.01); *G01N 21/8851* (2013.01);
(Continued)

(58) Field of Classification Search
CPC .......... H01L 21/67288; G01N 21/4788; G01N 21/8851; G01N 21/9501; G01N 2201/021; G01N 2201/0636; G06N 20/00
See application file for complete search history.

(56) References Cited

U.S. PATENT DOCUMENTS 7,242,659 B2 *   7/2007   Chung ............... G11B 7/13927
                                                      369/120
7,375,810 B2    5/2008   Nikoonahad et al.
(Continued)

*Primary Examiner* — Mohamed Charioui
*Assistant Examiner* — Lynda Dinh
(74) *Attorney, Agent, or Firm* — Sughrue Mion, PLLC

(57) ABSTRACT

Provided are a diffraction-based metrology apparatus having high measurement sensitivity, a diffraction-based metrology method capable of accurately performing measurement on a semiconductor device, and a method of manufacturing a semiconductor device using the metrology method. The diffraction-based metrology apparatus includes a light source that outputs a light beam, a stage on which an object is placed, a reflective optical element that irradiates the light beam onto the object through reflection, such that the light beam is incident on the object at an inclination angle, the inclination angle being an acute angle, a detector that detects a diffracted light beam that is based on the light beam reflected and diffracted by the object and a processor that measures a 3D pupil matrix for the diffracted light beam and analyze the object based on the 3D pupil matrix.

16 Claims, 32 Drawing Sheets

(51) Int. Cl.
  *G01N 21/88* (2006.01)
  *G01N 21/95* (2006.01)
  *G06N 20/00* (2019.01)

(52) U.S. Cl.
  CPC ... *G01N 21/9501* (2013.01); *G01N 2201/021* (2013.01); *G01N 2201/0636* (2013.01); *G06N 20/00* (2019.01)

(56) References Cited

U.S. PATENT DOCUMENTS

| | | |
|---|---|---|
| 8,339,595 B2 | 12/2012 | Den Boef |
| 8,817,273 B2 | 8/2014 | Jeong et al. |
| 10,209,183 B2 * | 2/2019 | Grunzweig ........ G01N 21/4788 |
| 10,215,693 B2 | 2/2019 | Krishnan et al. |
| 2004/0061917 A1 * | 4/2004 | Mushika ............ G02B 26/0841 |
| 2009/0021750 A1 * | 1/2009 | Korner .................... G06T 7/521 |
| | | 356/601 |
| 2015/0345934 A1 * | 12/2015 | Shafir .................... G01B 11/02 |
| | | 356/614 |
| 2018/0164227 A1 | 6/2018 | Kim et al. |
| 2018/0239160 A1 | 8/2018 | Roobol et al. |
| 2019/0103248 A1 | 4/2019 | Niu et al. |
| 2019/0204180 A1 * | 7/2019 | Medvedyeva .......... G03F 7/705 |
| 2019/0369374 A1 | 12/2019 | Forcht et al. |
| 2020/0011995 A1 * | 1/2020 | Send ...................... G01S 17/42 |
| 2020/0050114 A1 * | 2/2020 | Bozkurt ............. G01N 21/9501 |

* cited by examiner

Vertical illumination    Oblique illumination

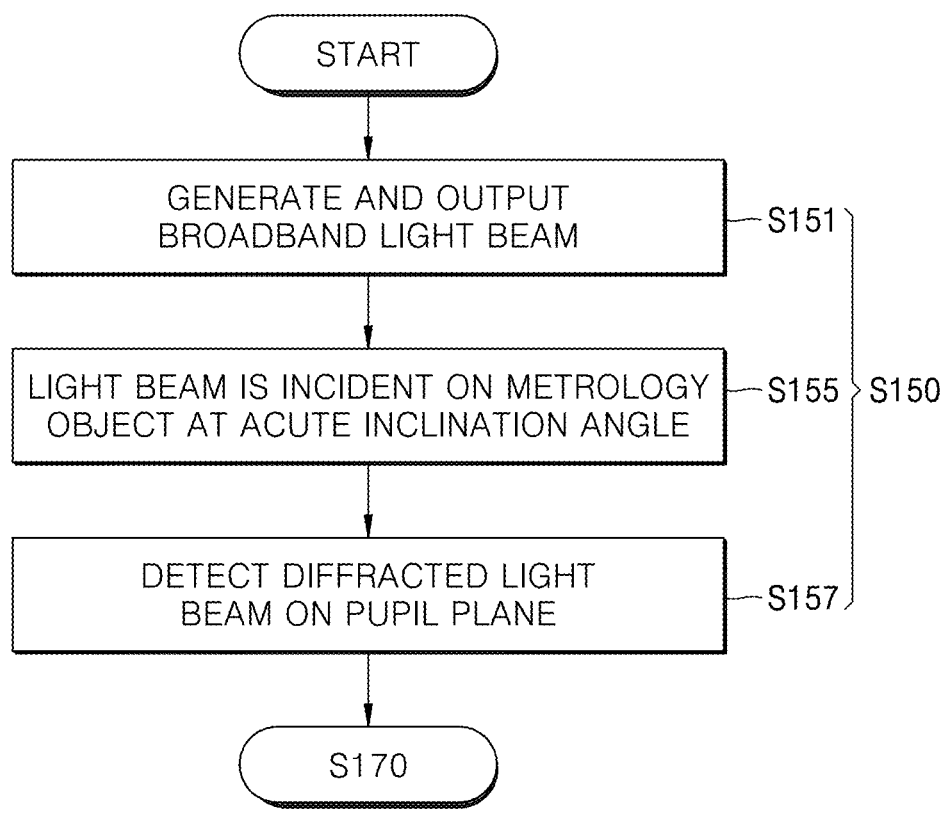

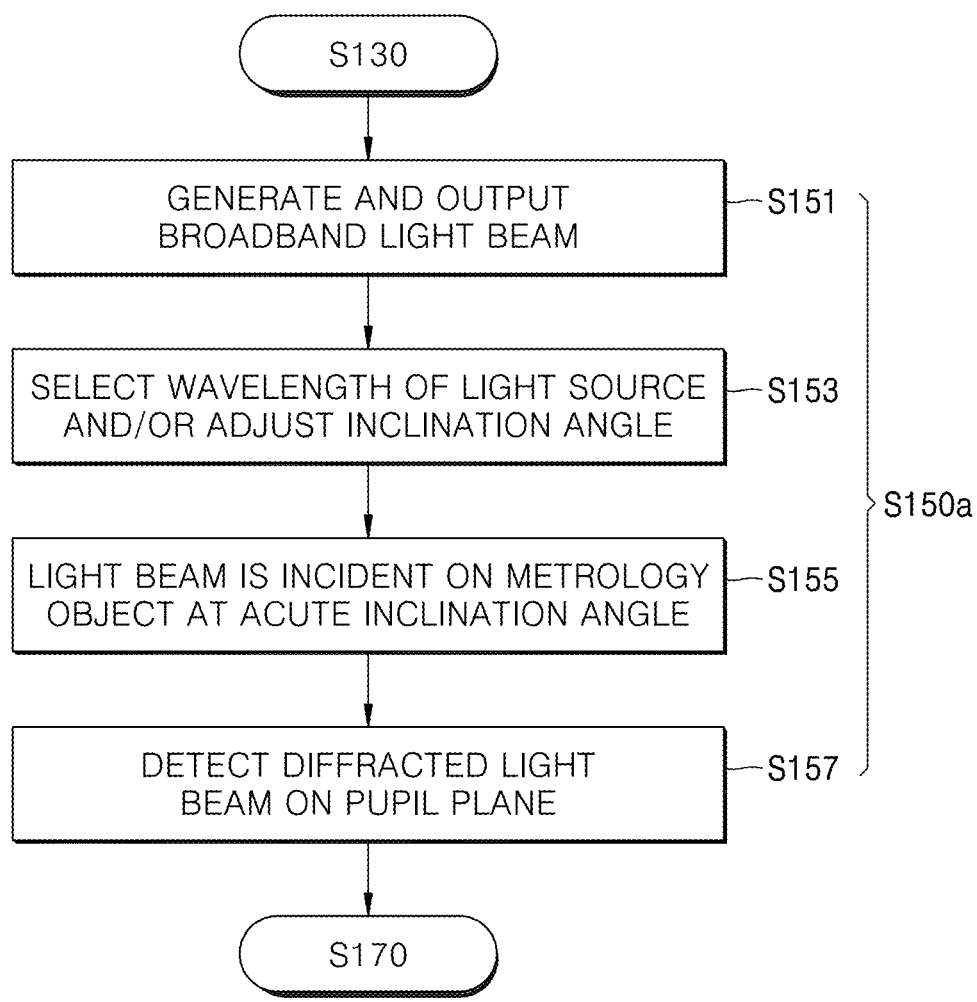

METROLOGY APPARATUS AND METHOD BASED ON DIFFRACTION USING OBLIQUE ILLUMINATION AND METHOD OF MANUFACTURING SEMICONDUCTOR DEVICE USING THE METROLOGY METHOD

CROSS-REFERENCE TO RELATED APPLICATION

This application is based on and claims priority under 35 U.S.C. § 119 to Korean Patent Application No. 10-2020-0083129, filed on Jul. 6, 2020, in the Korean Intellectual Property Office, the disclosure of which is incorporated by reference herein in its entirety.

BACKGROUND

The inventive concept relates to a metrology apparatus and a metrology method, and more particularly, to a diffraction-based metrology apparatus and a diffraction-based metrology method.

Currently, in semiconductor manufacturing processes, design rules are being continuously shrunk, and thus, the sizes of patterns on a wafer or a mask are being miniaturized. Also, a metrology apparatus that measures patterns or defects on a wafer or a mask may have problems like degradation in sensitivity and measurement accuracy that occur because of the miniaturized pattern sizes. To resolve these problems, a method of improving optical resolution is continuously researched and developed. Meanwhile, a related art measurement technique using vertical incidence illumination has reached its limit in measurement sensitivity due to the limitation of NA (Numerical Aperture) and wavelength ranges. Therefore, there is a demand for a technique for precise measurement and overcoming the limitations of measurement sensitivity.

SUMMARY

The inventive concept provides a diffraction-based metrology apparatus having high measurement sensitivity and a diffraction-based metrology method capable of accurately performing measurement on a semiconductor device and improving versatility in a semiconductor process and a method of manufacturing a semiconductor device using the metrology method.

According to an aspect of the disclosure, there is provided an apparatus comprising a light source configured to output a light beam; a stage on which an object is placed; a reflective optical element configured to irradiate the light beam onto the object through reflection, such that the light beam is incident on the object at an inclination angle, the inclination angle being an acute angle; a detector configured to detect a diffracted light beam that is based on the light beam reflected and diffracted by the object; and a processor configured to measure a 3D pupil matrix for the diffracted light beam and analyze the object based on the 3D pupil matrix.

According to another aspect of the disclosure, there is provided an apparatus comprising a light source configured to output a light beam; a stage on which an object is placed; a reflective optical element configured to irradiate the light beam onto the object through reflection, such that the light beam is incident on the object at an inclination angle, the inclination angle being an acute angle; an angle adjuster configured to adjust the inclination angle; a detector configured to detect a diffracted light beam based on the light beam reflected and diffracted by the object, wherein a pupil image, which is an image formed on a pupil plane of the diffracted light beam, is detected; and a processor configured to measure a 3D pupil matrix for the diffracted light beam, which comprises a wavelength of the light beam, the inclination angle, and intensity of the diffracted light beam as variables, and analyze an overlay error of the object based on the 3D pupil matrix.

According to another aspect of the disclosure, there is provided a method comprising: preparing an object for measurement; outputting a light beam from a light source; irradiating the light beam onto the object through reflection by a reflective optical element, such that the light beam is incident on the object at an inclination angle having an acute angle; detecting, by a detector, a diffracted light beam reflected and diffracted from the object as a pupil image on a pupil plane; measuring a 3D pupil matrix for the diffracted light beam; and analyzing the object based on the 3D pupil matrix.

According to another aspect of the disclosure, there is provided a method of manufacturing a semiconductor device, the method comprising: preparing the semiconductor device, which is an object to be measured; outputting a light beam from a light source; irradiating the light beam onto the semiconductor device through reflection by a reflective optical element, such that the light beam is incident on the semiconductor device at an inclination angle having an acute angle; detecting, by a detector, a diffracted light beam reflected and diffracted from the semiconductor device as a pupil image on a pupil plane; measuring a 3D pupil matrix for the diffracted light beam; analyzing an overlay error of the semiconductor device based on the 3D pupil matrix; determining whether the overlay error is within an allowable range; and when the overlay error is within the allowable range, performing subsequent processes for the semiconductor device.

According to another aspect of the disclosure, there is provided an apparatus comprising: a memory storing one or more instructions; and a processor configured to: control a light source to output a light beam; receive detected information corresponding to a diffracted light beam that is based on the light beam reflected and diffracted by an object, the light beam being irradiated onto the object at an inclination angle; measure a 3D pupil matrix for the diffracted light beam based on the detected information; and analyze the object based on the 3D pupil matrix.

According to another aspect of the disclosure, there is provided a method comprising: controlling a light source to output a light beam; receiving detected information corresponding to a diffracted light beam that is based on the light beam reflected and diffracted by an object, the light beam being irradiated onto the object at an inclination angle; measuring a 3D pupil matrix for the diffracted light beam based on the detected information; and analyzing the object based on the 3D pupil matrix.

BRIEF DESCRIPTION OF THE DRAWINGS

Embodiments of the inventive concept will be more clearly understood from the following detailed description taken in conjunction with the accompanying drawings in which:

FIGS. 16A and 16B are flowcharts showing operations for diffraction-based measurement in the metrology method of FIG. 15 in more detail.

DETAILED DESCRIPTION OF THE EMBODIMENTS

Figure 1:
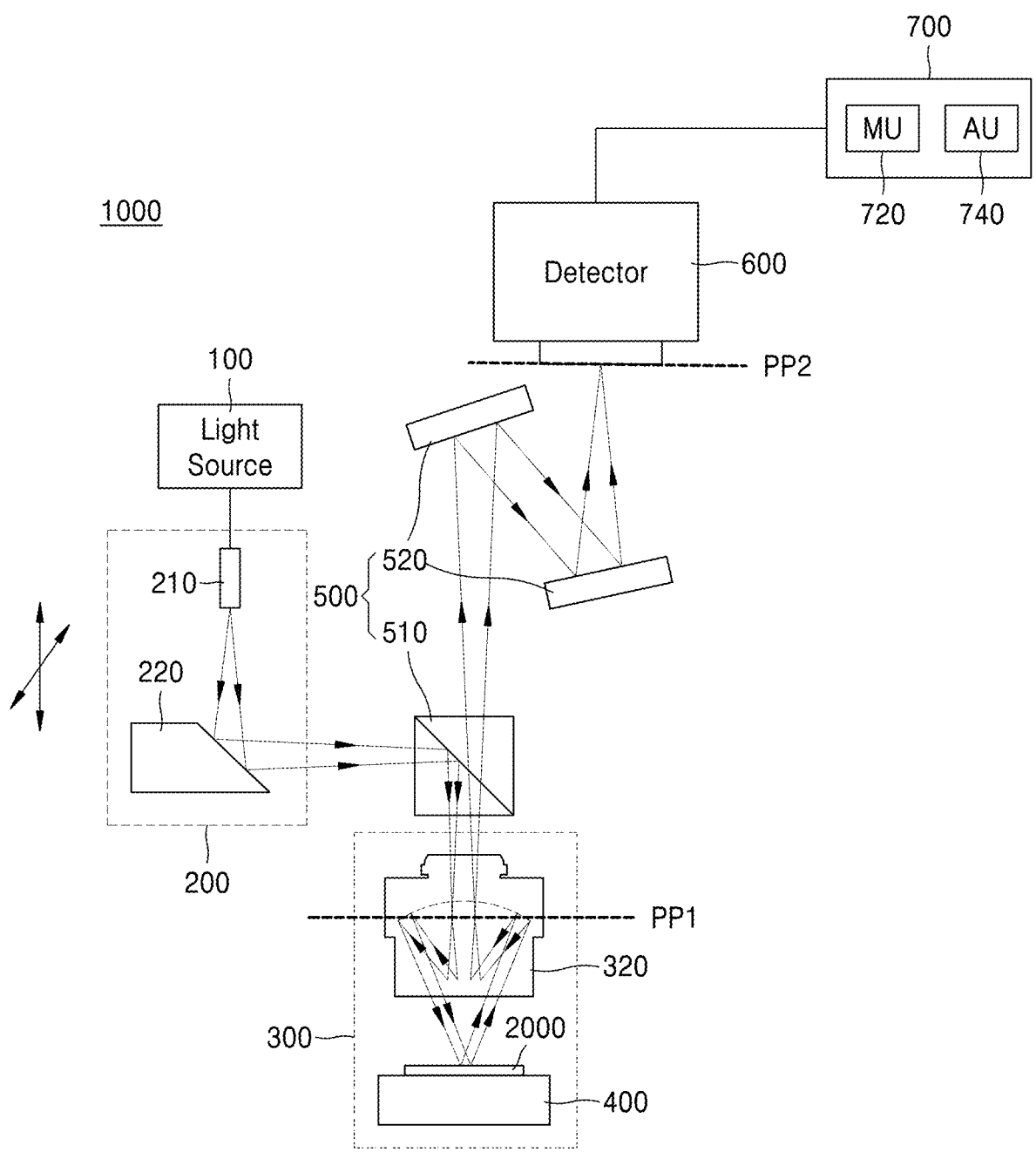
FIG. 1 is a schematic structural diagram of a diffraction-based metrology apparatus using oblique illumination according to an example embodiment of the inventive concept.

FIG. 1 is a schematic structural diagram of a diffraction-based metrology apparatus using oblique illumination according to an example embodiment of the inventive concept.

Referring to FIG. 1, a diffraction-based metrology apparatus 1000 (hereinafter simply referred to as a 'metrology apparatus') using oblique illumination according to the example embodiment may include a broadband light source 100, an angle adjuster 200, a first reflective optics 300, a stage 400, a second reflective optics 500, a detector 600, and a processor 700.

The broadband light source 100 may generate and output a broadband light beam. For example, the broadband light source 100 may generate and output a broadband light beam in a wavelength range from 180 nm to 20,000 nm. However, the wavelength range of a light beam that may be generated by the broadband light source 100 is not limited to the numerical range. For example, the broadband light source 100 may generate and output a light beam in a narrower wavelength range, e.g., from 250 nm to 1,100 nm.

According to an example embodiment, the broadband light source 100 may output a light beam while scanning the wavelength range with a short wavelength. For example, the broadband light source 100 may output a plurality of monochrome light beams while sweeping the wavelength range with a width of a short wavelength by using a monochromator or the like. Here, a monochrome light beam may refer to a light beam having a short wavelength width from several nm to dozens of nm.

Meanwhile, the broadband light source 100 may output light beams including the entire wavelength range at once. For example, the broadband light source 100 may be a white light-type light source like a super-continuum and may output light including the entire wavelength range. In the case of using a white light-type as the broadband light source 100, when a diffracted light beam is detected, the diffracted light beam may be separated for respective wavelengths by using a spectrometer. According to an example embodiment, the spectrometer may be a diffraction grating or a prism, but the disclosure is not limited thereto.

The metrology apparatus 1000 according to the example embodiment may the broadband light source 100 for generating a broadband light beam for the following reasons. First, a light beam having an appropriate wavelength may be selected and used according to a pattern size, an interlayer thickness, or material properties of an object to be measured. Hereinafter, the object to be measured may be referred to as a metrology object 2000. Detailed descriptions thereof will be given below with reference to FIGS. 2A and 2B. Second, a light beam having the maximum sensitivity may be used according to an inclination angle of oblique illumination. Detailed descriptions thereof will be given below with reference to FIGS. 8A-8B, 9A-9C and 10. Third, an overlay error curve may be calculated based on various wavelengths, and the asymmetry of an overlay mark may be determined through the overlay error curve. Detailed descriptions thereof will be given below with reference to FIGS. 11A11B, 12 and 13.

The angle adjuster 200 may refer to a module capable of actively changing an angle of illumination incident on the metrology object 2000, that is, an inclination angle of a light beam incident on the top surface of the metrology object 2000. For example, the angle adjuster 200 may include an elliptical mirror 220 to change an inclination angle of a light beam and may move the light beam up, down, left, and right as indicated by the arrows. According to another example embodiment, the angle adjuster 200 may include an off-axis parabola (OAP) mirror. However, the elements included in the angle adjuster 200 is not limited to the elliptical mirror 220 or the OAP mirror. For example, according the inventive concept, the angle adjuster 200 may include all types of optical elements capable of adjusting the inclination angle of a light beam incident on the metrology object 2000. The angle adjuster 200 may include a mirror-type optical element like a Galvano mirror, a wavefront adjusting-type optical element like a digital micromirror device (DMD), a spatial light module (SLM), and a deformable mirror (DM), or a translation-type optical element. The mirror-type optical element may refer to an optical element that adjusts the inclination angle of a light beam by changing the path of a reflected light beam through rotation, the wavefront adjusting-type optical element may refer to an optical element that adjusts the inclination angle of a light beam by changing the shape of a wavefront, and the translation-type optical element may refer to an optical element that adjusts the inclination angle of a light beam by moving a light outputting device linearly.

Meanwhile, when a light beam is incident on the top surface of the metrology object 2000 with a fixed inclination angle, a module like the angle adjuster 200 for controlling the inclination angle may not be needed. However, as described below with reference to FIGS. 8A-8B, 9A-9C and 10, the angle adjuster 200 may enable selection of a wavelength range and expansion of the wavelength range by adjusting the inclination angle for maximization of sensitivity.

According to an example embodiment, the position and the shape of a light beam need to be adjusted on the pupil plane of an object lens, such that the light beam is incident on the top surface of a metrology object at a desired inclination angle. Generally, an aperture mask having various shapes and sizes is fabricated and installed on the pupil plane to change the shape of a light beam, such that illumination of a desired form is incident on a metrology object. However, this method has a limitation when a quick response according to an angle change is needed. To overcome the limitation of the method, in the metrology apparatus 1000 of the example embodiment, a Koehler Illumination is used, and the angle adjuster 200 may be used to freely adjust the inclination angle and the azimuth angle of light.

Meanwhile, an optical fiber 210 may transmit a light beam from the broadband light source 100 to the elliptical mirror 220. The optical fiber 210 may be included as a component of the angle adjuster 200 or may be omitted. According to an example embodiment, the angle adjuster 200 may include a rotating steering mirror. Also, optical elements like a collimating mirror, a polarizer, and a compensator may be provided between the broadband light source 100 and the angle adjuster 200.

The first reflective optics 300 may include a reflective object lens 320 having high magnification power or high numerical aperture (NA). The first reflective optics 300 may cause a light beam to be incident on the top surface of the metrology object 2000 at an acute inclination angle by using the object lens 320. Also, the inclination angle of a light beam incident on the metrology object 2000 may be adjusted by adjusting a focal position of a light beam on a pupil plane PP1 in the object lens 320 through the angle adjuster 200. In FIG. 1, the pupil plane PP1 for a light beam incident on the metrology object 2000 is indicated by a dashed line. The structure of the object lens 320 and adjustment of an inclination angle will be described in more detail in the description of FIG. 3.

According to an example embodiment, in order to use a broadband light source, an optical system may be configured as a reflective optics. This is because, in a refractive optics using a lens, the refractive index of the glass constituting the lens is changed according to wavelengths, and thus, chromatic aberration may occur. As a result, serious performance degradation may occur. However, because a reflective optics generally uses mirror reflection without wavelength dependency, the same performance may be obtained without chromatic aberration for broadband light beams in the wavelength range from 180 nm to 20,000 nm. Therefore, the metrology apparatus 1000 of the example embodiments of the inventive concept may include a reflective optics to ensure measurement performance and precise operation. Here, the reflective optics may include not only the first reflective optics 300 including the object lens 320, but also the angle adjuster 200 and the second reflective optics 500. In other words, in the metrology apparatus 1000 according to the example embodiments of the inventive concept, a light beam from the broadband light source 100 is transmitted to the metrology object 2000 through one or more reflective optical elements, and a diffracted light beam reflected and diffracted from the metrology object 2000 may also be transmitted to the detector 600 through one or more reflective optical elements.

The stage 400 may support and fix the metrology object 2000. For example, the metrology object 2000 may be provided on the top surface of the stage 400, and the stage 400 may support and fix the bottom surface of the metrology object 2000. The stage 400 may be a 3-dimensional stage capable of moving 3-dimensionally. As the stage 400 moves, the metrology object 2000 may also move. For example, through the movement of the stage 400, focusing along the z-axis or scanning on the x-y plane may be performed with respect to the metrology object 2000. Here, the z-axis may correspond to a normal perpendicular to the top surface of the stage 400 or the metrology object 2000, and the x-y plane may correspond to the top surface of the stage 400 or the metrology object 2000 or a plane perpendicular to the z-axis.

Meanwhile, the metrology object 2000 may be, for example, a mask or a wafer including a pattern. Also, the metrology object 2000 may be a semiconductor device including a multiple pattern layer and an overlay mark. Here, the overlay mark is a mark for measuring an overlay error of the multiple pattern layers, and the overlay error may refer to a degree of misalignment between an upper pattern and a lower pattern in the multiple pattern layers. Therefore, the metrology apparatus 1000 may measure and analyze various characteristics of the metrology object 2000 according to an example embodiment. For example, the metrology apparatus 1000 according to the example embodiment may measure and analyze an overlay error, a pattern size, a pattern thickness, and pattern uniformity. Also, according to one or more example embodiments, the metrology apparatus 1000 may also detect a defect of the metrology object 2000 like a pattern defect or a foreign substance.

The second reflective optics 500 may include a beam splitter 510 and a relay mirror 520. The beam splitter 510 may emit a light beam from the angle adjuster 200 toward the metrology object 2000 and may emit a light beam from the first reflective optics 300 toward the detector 600. In detail, the beam splitter 510 may reflect a light beam from the angle adjuster 200, such that the light beam is obliquely incident to the metrology object 2000 through the first reflective optics 300. Also, a diffracted light beam reflected and diffracted by the metrology object 2000 is incident to the beam splitter 510 through the first reflective optics 300, and the beam splitter 510 may transmit the diffracted light beam therethrough, such that the diffracted light beam is incident on the detector 600 through the relay mirror 520. Meanwhile, according to an embodiment, the beam splitter 510 may transmit a light beam from the angle adjuster 200 therethrough and emit the light beam toward the metrology object 2000 and also may also reflect a light beam from the first reflective optics 300 and emit the light beam toward the detector 600.

The relay mirror 520 may lead a light beam from the beam splitter 510 to be incident on the detector 600 through reflection. According to an example embodiment of the metrology apparatus 1000 illustrated in FIG. 1, two relay mirrors 520 may be provided. However, the number of relay mirrors 520 is not limited to two. For example, one relay mirror 520 may be provided or three or more relay mirrors 520 may be provided according to other example embodiments.

The detector 600 may detect a diffracted light beam reflected and diffracted by the metrology object 2000. The detector 600 may detect a diffracted light beam incident on the detector 600 through the first reflective optics 300, the beam splitter 510, and the relay mirror 520. In the metrology apparatus 1000 according to the example embodiment, the detector 600 may detect an image of a diffracted light beam on a pupil plane PP2, that is, a pupil image. In FIG. 1, the pupil plane PP2 for a diffracted light beam incident on the detector 600 is indicated by a dashed line. In the metrology apparatus 1000 according to the example embodiment, because the detector 600 directly detects a pupil image, separate condensing lenses for condensing a diffracted light beam are not needed. Also, because no lens is used, there is no concern that chromatic aberration may occur according to wavelengths. Also, because a diffracted light beam is detected on a pupil plane, it may be easy for measuring accurate intensity of the diffracted light beam. The detector 600 may be, for example, a charge-coupled device (CCD) or a photo-multiplier tube (PMT). Of course, the detector 600 is not limited to the above-described devices.

The processor 700 may measure a 3D pupil matrix and analyze the metrology object 2000 based on the 3D pupil matrix. In detail, the processor 700 may include a measurement unit (MU) 720 and an analyzing unit (AU) 740. A 3D pupil matrix may be measured by the MU 720, and the metrology object 2000 may be analyzed by the AU 740 based on the 3D pupil matrix. The 3D pupil matrix will be described below in more detail with reference to FIGS. 4A and 4B.

Meanwhile, a method of analyzing the metrology object 2000 by the AU 740 may vary depending on the purpose of measurement for the metrology object 2000. For example, when an overlay error of the metrology object 2000 is the purpose of measurement, the AU 740 may analyze an overlay error value and whether the overlay error value is within an allowable range. When the size of a pattern of the metrology object 2000 is the purpose of measurement, the AU 740 may analyze the size of the pattern and whether the size of the pattern is normal. When the uniformity of the pattern of the metrology object 2000 is the purpose of measurement, the AU 740 may analyze whether the uniformity of the pattern is normal. Meanwhile, when detection of a defect in the metrology object 2000 is the purpose of measurement, the AU 740 may analyze whether there is a defect in the metrology object 2000.

The metrology apparatus 1000 according to an example embodiment may include the broadband light source 100, the angle adjuster 200 for adjusting an inclination angle, the first reflective optics 300 including the reflective object lens 320, and the detector 600 for detecting a pupil image, and thus, the metrology object 2000 may be analyzed with a measurement sensitivity that is about 3 times of that of a related art metrology apparatus using vertical illumination. Also, the metrology apparatus 1000 according to an example embodiment may analyze the metrology object 2000 with optimal measurement sensitivity by obtaining a large 3D pupil matrix and performing regression or machine learning thereon. On the other hand, the metrology apparatus 1000 according to an example embodiment may determine the asymmetry of an overlay mark based on the use of a broadband light beam in relation to measurement of the overlay error and change process conditions for the overlay mark.

Therefore, the metrology apparatus 1000 according to an example embodiment may accurately measure a semiconductor device, which is a metrology object, and may improve the response capability in a semiconductor process, e.g., a process for an overlay mark. The improvement in measurement sensitivity will be described below in more detail with reference to FIGS. 5A-5B, 6A-6B, 7A-7B, 8A-8B, 9A-9C and 10, and the asymmetry of the overlay mark will be described below in more detail with reference to FIGS. 11A-11B, 12 and 13.

Figure 2A:
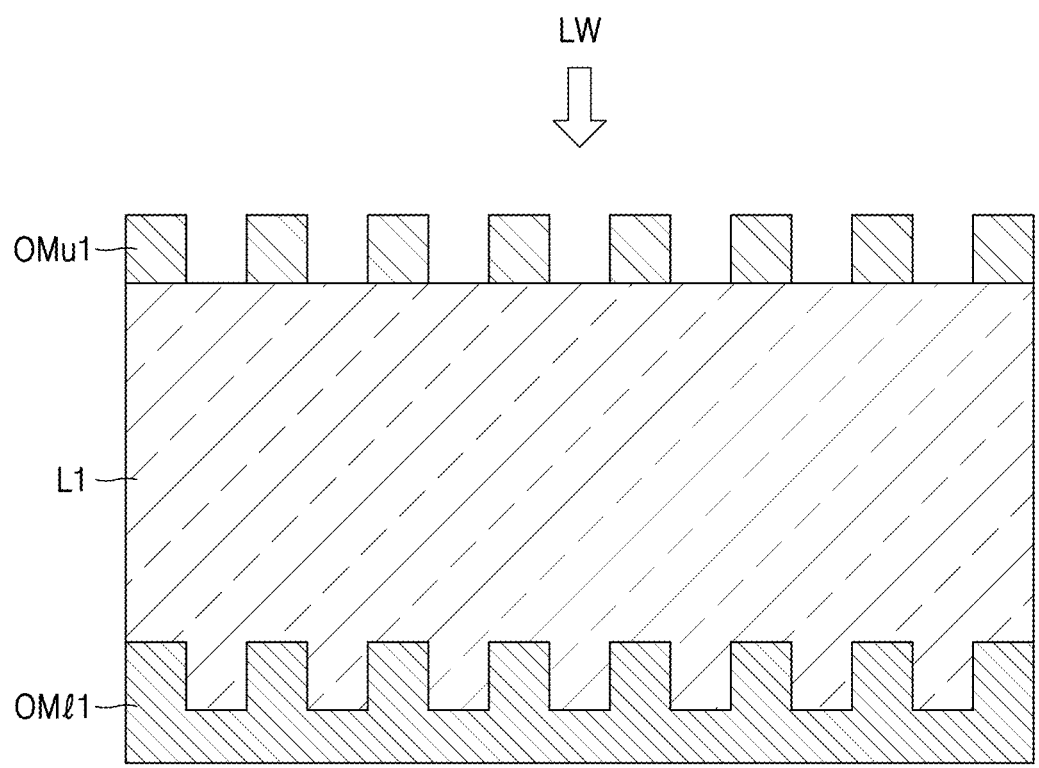
FIGS. 2A to 2C are cross-sectional views of overlay marks for describing the necessity of a broadband light source.
Figure 2B:
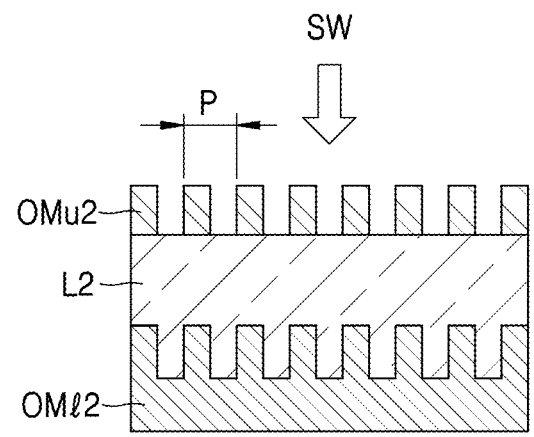
Figure 2C:
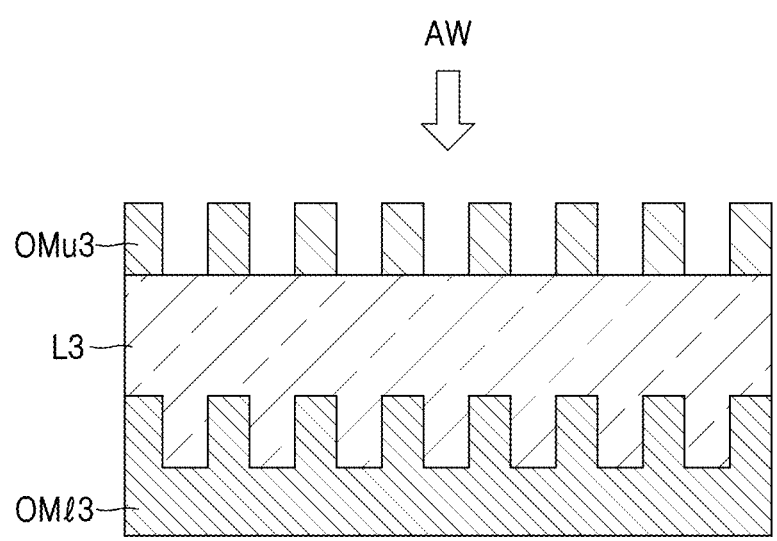

FIGS. 2A to 2C are cross-sectional views of overlay marks for describing the necessity of a broadband light source in a semiconductor manufacturing process.

Referring to FIGS. 2A to 2C, as semiconductor processes are diversified, multiple wavelength ranges may be needed to measure overlay errors. For example, when the thickness of a layer L1 between a lower overlay mark OMl1 and an upper overlay mark OMu1 is large as shown in FIG. 2A, a long wavelength light beam LW with a high transmittance may be used. Also, when a pitch P of lower and upper overlay marks OMl2 and OMu2 is small as shown in FIG. 2B, a short wavelength light beam SW in the UV band or the EUV band may be used to secure resolution. On the other hand, as shown in FIG. 2C, when light beams in a particular wavelength range are not transmitted due to the nature of a material constituting a layer L3 between a lower overlay mark OMl3 and an upper overlay mark OMu3, an avoidance wavelength light beam AW may be used. When a light beam from the broadband light source 100 is limited to a short wavelength or a narrow wavelength range, it may be difficult to respond to sample changes or various measurement variables in various processes. Therefore, the metrology apparatus 1000 of the example embodiment may resolve the above-stated problems by including the broadband light source 100.

Figure 3:
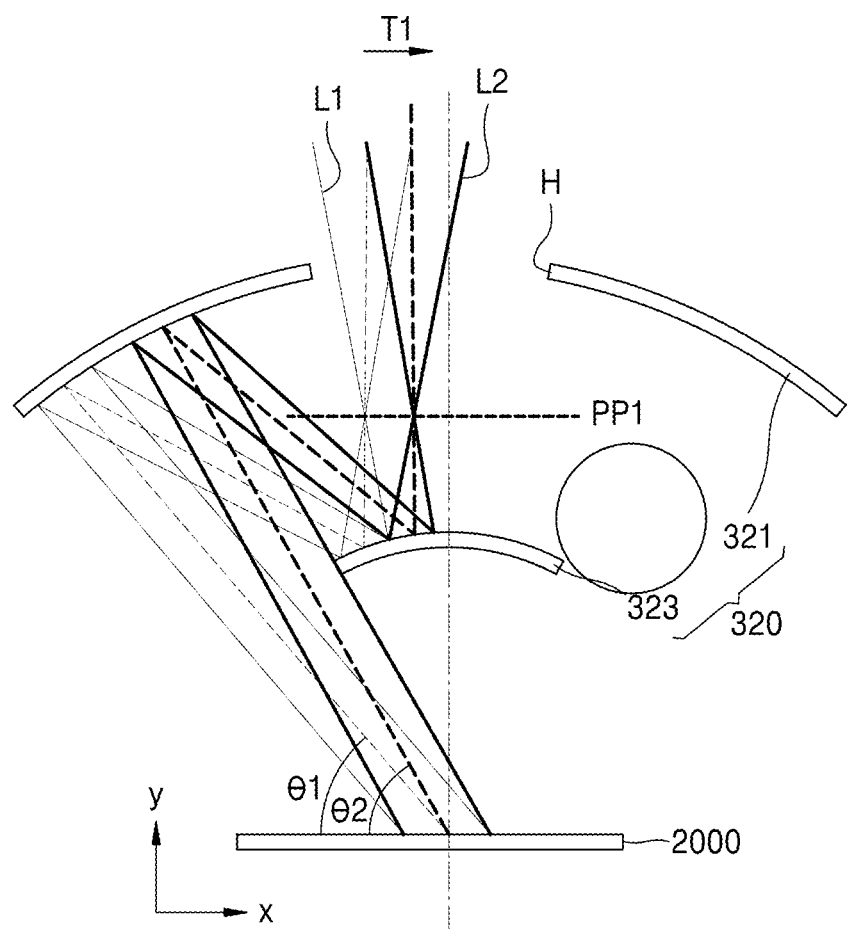
FIG. 3 is a conceptual diagram illustrating control of an inclination angle of oblique illumination in reflective optics of the metrology apparatus of FIG. 1.

FIG. 3 is a conceptual diagram for describing adjustment of an inclination angle of oblique illumination in a reflective optics of the metrology apparatus of FIG. 1. Descriptions will be given below with reference to FIG. 1 as well, and descriptions already given above with reference to FIG. 1 will be briefly given or omitted.

Referring to FIG. 3, in the metrology apparatus 1000 according to an example embodiment, the first reflective optics 300 may include the reflective object lens 320. The reflective object lens 320 may include a main mirror 321 in the form of an aspherical mirror and a secondary mirror 323 in the form of an aspherical mirror. Meanwhile, an open hole H may be formed at the center of the main mirror 321, and light beams L1 and L2 from the beam splitter 510 may be incident on the reflective object lens 320 through the open hole H.

As shown in FIG. 3, the light beams L1 and L2 from the beam splitter 510 may be incident through the open hole H, may be reflected by the secondary mirror 323 and the main mirror 321, and may be obliquely incident on the metrology object 2000. In detail, a first light beam L1 from the beam splitter 510 indicated by a thin solid line may be focused on the pupil plane PP1 through the open hole H, reflected by the secondary mirror 323, incident on the main mirror 321, reflected by the main mirror 321, and obliquely incident on the metrology object 2000 at a first inclination angle θ1. Also, a second light beam L2 from the beam splitter 510 indicated by a thick solid line may be focused on the pupil plane PP1 through the open hole H, reflected by the secondary mirror 323, incident on the main mirror 321, reflected by the main mirror 321, and obliquely incident on the metrology object 2000 at a second inclination angle θ2.

Meanwhile, as indicated by an arrow T1 of FIG. 3, the second light beam L2 is a light beam obtained by linearly moving the first light beam L1 in a first direction (x direction), and the inclination angles of light beams incident on the metrology object 2000 may be changed through linear movements of the light beams. For example, the first inclination angle θ1 may be less than the second inclination angle θ2. On the other hand, linear movement of a light beam may be performed through various types of optical elements in the angle adjuster 200 described above.

Figure 4A:
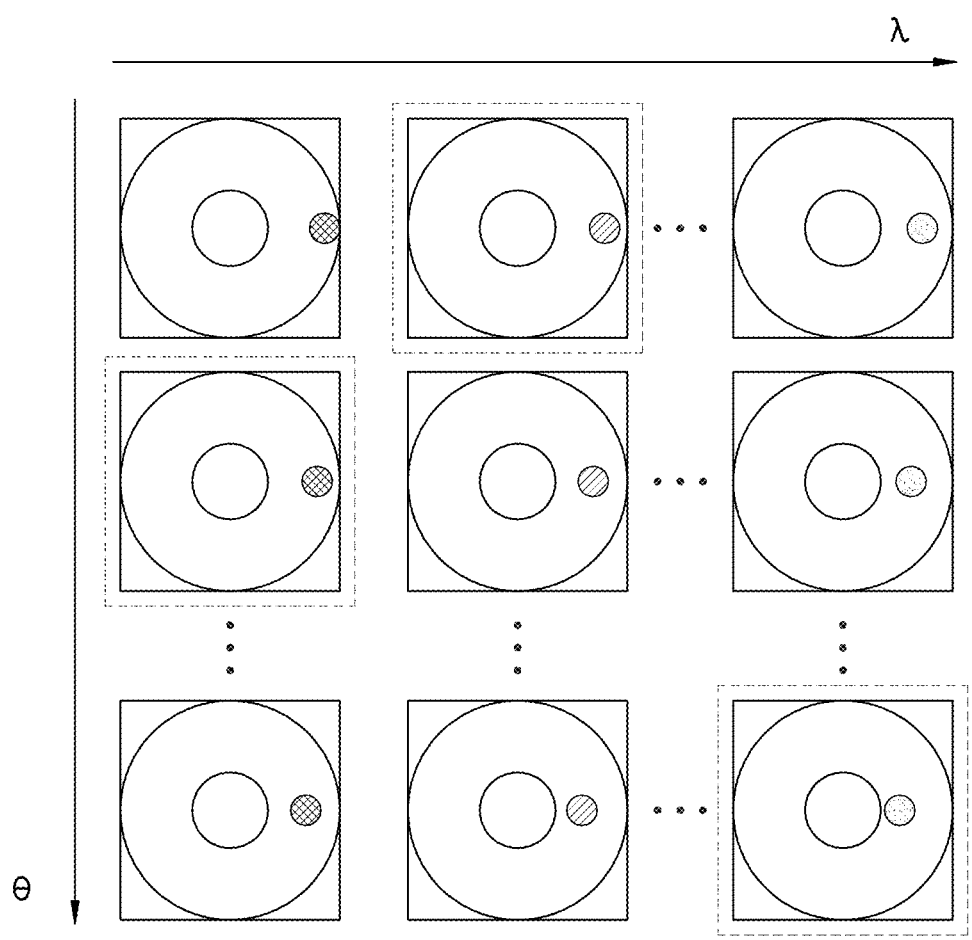
FIGS. 4A and 4B are a conceptual diagram and a graph for describing the concept of a 3D pupil matrix.
Figure 4B:
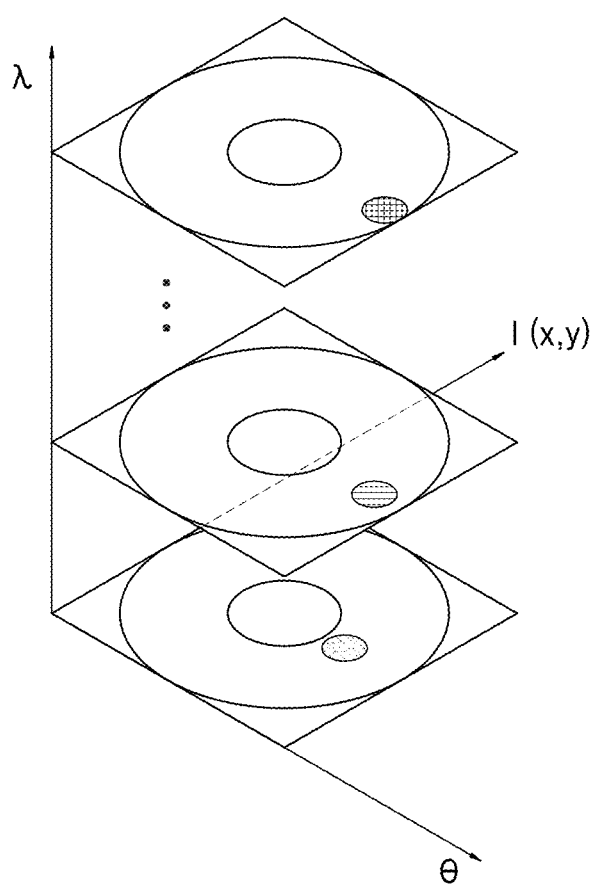

FIGS. 4A and 4B are a conceptual diagram and a graph for describing the concept of a 3D pupil matrix. Descriptions of FIGS. 4A to 4D will be given below with reference to FIG. 1, and descriptions already given above with reference to FIGS. 1, 2A-2C and 3 will be briefly given or omitted.

Referring to FIGS. 4A and 4B, the metrology apparatus 1000 according to an example embodiment may include the broadband light source 100, the angle adjuster 200 for adjusting an inclination angle, the first reflective optics 300 including the reflective object lens 320, and the detector 600 for detecting a pupil image, and thus, a large 3D pupil matrix may be obtained. Here, the 3D pupil matrix refers to a matrix having a wavelength 2 of a light beam, an inclination angle θ of a light beam incident on the metrology object 2000, and an intensity I of a diffracted light beam as variables, wherein the intensity I of the diffracted light beam may be computed from a pupil image for the diffracted light.

For example, FIG. 4A shows a plurality of pupil images that are obtained by varying wavelengths 2 of light beams in the x-axis direction and varying inclination angles θ in the y-axis direction. Also, small dots in the pupil images represent a first-order light beam, where it may be seen that the first-order light beam moves within the pupil images according to wavelengths and inclination angles. Meanwhile, a pupil image surrounded by a dashed rectangle may correspond to a pupil image having a maximum sensitivity at a corresponding wavelength and a corresponding inclination angle. To describe more simply with only nine pupil images shown in FIG. 4A, assuming that there are three types of wavelengths 2 of light beams along the x-axis and three types of inclination angles θ along the y-axis, a pupil image of the maximum sensitivity may be obtained at the middle inclination angle on the y-axis in the case of the left wavelength on the x-axis, a pupil image of the maximum sensitivity may be obtained at the upper inclination angle on the y-axis in the case of the middle wavelength on the x-axis, and a pupil image of the maximum sensitivity may be obtained at the lower inclination angle on the y-axis in the case of the right wavelength on the x-axis.

FIG. 4B shows the 3D pupil matrix described above as a 3D graph. In other words, the 3D pupil matrix may be represented as a 3-dimensional graph indicating the inclination angle θ as a first axis, the intensity I(x,y) of a diffracted light beam as a second axis, and a wavelength 2 of a light beam as a third axis. Meanwhile, the intensity I(x,y) may be given as intensity according to a position (x, y) in the pupil image. In other words, intensity information may be displayed in such a way that a diffracted light beam, e.g., a first-order light beam, is located at particular coordinates of x1 and y1 in the pupil image and has an intensity of I1.

In terms of obtaining a pupil image through the detector 600, the metrology apparatus 1000 according to an example embodiment may obtain large 3D pupil matrix data by using various wavelengths based on the broadband light source 100 and various inclination angles based on the adjustment of inclination angles by the angle adjuster 200. Also, the metrology object 2000 may be accurately analyzed with high measurement sensitivity based on the large 3D pupil matrix data. Also, by determining the asymmetry of an overlay mark through analysis of pupil matrix data, the metrology object 2000 may be more accurately analyzed.

For example, when a pitch and a material of an overlay mark are given, a wavelength and an angle corresponding to an optimum sensitivity may be calculated. Thereafter, pupil matrix data may be obtained by measuring the overlay mark with the wavelength and the angle corresponding to the optimum sensitivity, and the pupil matrix data may be analyzed. By determining whether an overlay mark is symmetric or asymmetric through analysis of pupil matrix data, an overlay error of the metrology object 2000 may be more accurately analyzed.

Figure 5A:
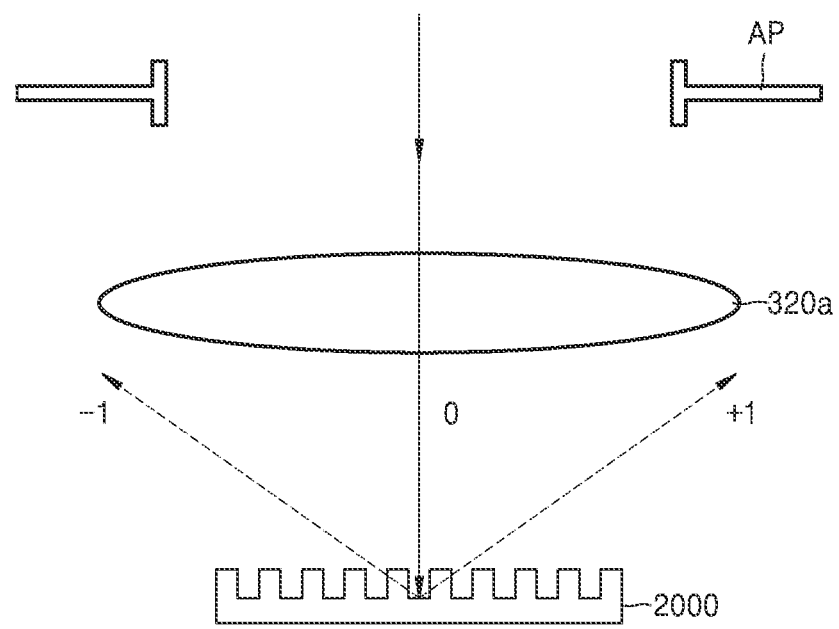
FIGS. 5A and 5B are conceptual diagrams for describing an increase in measurement sensitivity due to the use of oblique illumination.
Figure 5B:
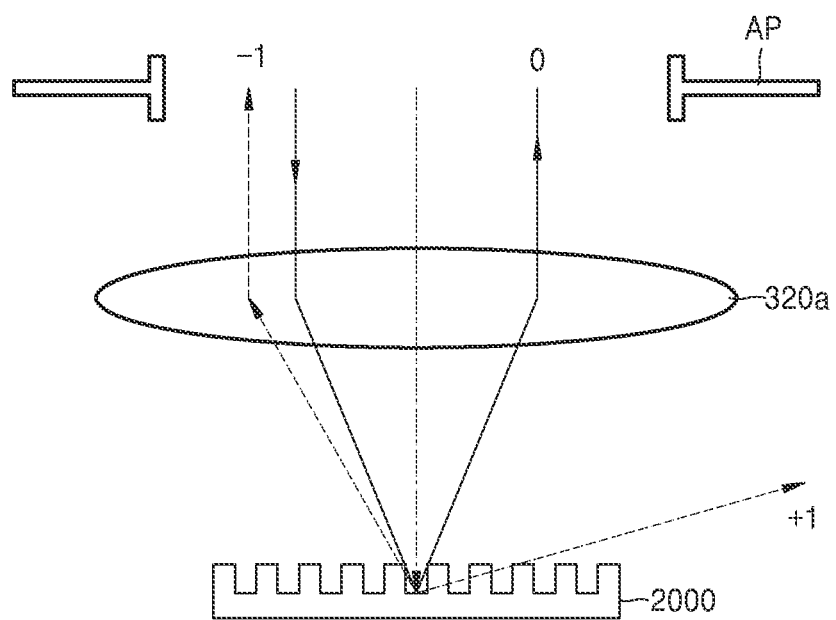

FIGS. 5A and 5B are conceptual diagrams for describing an increase in measurement sensitivity due to the use of oblique illumination, wherein, for convenience of explanation, a refractive object lens structure is used instead of a reflective object lens. Descriptions of FIGS. 5A and 5B will be given below with reference to FIG. 1, and descriptions already given above with reference to FIGS. 1, 2A-2C, 3, and 4A-4B will be briefly given or omitted.

Referring to FIGS. 5A and 5B, a light beam reflected by the metrology object 2000 may be diffracted due to a pattern on the metrology object 2000. In other words, a light beam diffracted from the metrology object 2000 through reflection, that is, a diffracted light beam, may include a plurality of higher order light beams including a zero-order light beam at the center. However, because the metrology apparatus 1000 according to an example embodiment mainly uses a zero-order light beam and a first-order light beam for measurement, for convenience of explanation, FIGS. 5A and 5B only show a zero-order light beam 0 and first-order light beams −1 and +1. Moreover, while the metrology apparatus 1000 mainly uses a zero-order light beam and a first-order light beam for measurement, the metrology apparatus 1000 according to the example embodiment may not entirely exclude the use of a second-order light beam or higher-order light beams for measurement. Hereinafter, descriptions will be given in relation to a diffracted light beam only with the zero-order light beam 0 and the first-order light beams −1 and +1.

In the case of the first-order light beams −1 and +1, a diffraction angle thereof may vary according to a size or a pitch of a pattern on the metrology object 2000. For example, as the pitch of the pattern decreases, the diffraction angle of the first-order light beams −1 and +1 becomes relatively large.

On the other hand, as shown in FIG. 5A, when a light beam is vertically incident on the metrology object 2000 and the pattern of the metrology object 2000 is a fine pattern with a small pitch, as indicated by dashed lines, the diffraction angle of the first-order light beams −1 and +1 is greater than the NA of an object lens 320a, and thus, only the zero-order light beam 0 indicated by a solid line from among reflected diffracted light beams may be incident on a detector through the object lens 320a and an aperture AP. Therefore, the resolution of a pupil image obtained by the detector may be low or it may not be possible to measure a diffracted light beam.

On the other hand, when a light beam is obliquely incident on the metrology object 2000 as shown in FIG. 5B, even when the size and the pitch of a pattern of the metrology object 2000 are small, some of the first-order light beams −1 and +1, e.g., a first-order light beam −1, may be incident on the detector through the aperture AP together with the zero-order light beam 0. Therefore, the resolution of a pupil image obtained by the detector may be significantly improved.

Obliquely incident illumination may theoretically increase the measurement sensitivity up to two times as compared to vertically incident illumination. To briefly describe the increase in measurement sensitivity with an overlay error, generally, a measurement sensitivity K for an overlay error may be defined as a difference between the intensity of first-order light beams, that is, $K=I_{+1}-I_{-1}$. Here, $I_{+1}$ and $I_{-1}$ denote the intensity of a first-order light beam +1 and the intensity of a first-order light beam −1, respectively. Meanwhile, the measurement sensitivity K may be represented by the following proportional equation (1) with respect to a pattern pitch P, an inclination angle θ, and a wavelength λ of a light beam.

$$K \propto \sin \psi / P \qquad \text{proportional equation (1)}$$

Here, ψ denotes a function regarding the inclination angle θ and the wavelength λ of a light beam.

According to the proportional equation (1), it may be seen that, as the smaller pitch P of the pattern and the more optimal inclination angle θ and the wavelength λ are used, the measurement sensitivity K may increase. On the other hand, the angle of a diffracted light beam generated from an overlay mark, e.g., an angle φ of a first-order light beam, may have a relationship of the following equation (1) with respect to the pitch P of the pattern and the wavelength λ of a light beam.

$$\lambda/P = \sin \varphi \qquad \text{Equation (1)}$$

When the angle of the first-order light beam is out of the numerical aperture (NA) of an object lens due to a very small pitch P of the pattern, measurement is not possible. Therefore, in the case of a vertical incidence, the smallest usable pattern pitch Pp may be restricted by λ/NA (object). Here, the NA (object) may be represented as $n \sin \varphi$, and when the refractive index n of the air is 1, the NA (object) may be represented as $\sin \varphi$. Also, when the sensitivity is not optimal at a wavelength being used, the sensitivity may be more severely deteriorated. Therefore, when an overlay error is very small, a related art metrology apparatus using vertical incidence is unable to measure the corresponding overlay error.

Meanwhile, in the case of oblique illumination, the smallest usable pattern pitch Po may be expressed as λ/{(NA (object)+NA(θ)}. Here, NA(θ) is an NA according to the inclination angle θ. When the inclination angle θ is 0, that is, in the case of vertical incidence, NA(θ) is 0. When the inclination angle θ is the maximum measurable inclination angle, the NA(θ) becomes substantially the same as the NA(object). Therefore, in the case of oblique illumination, the smallest usable pattern pitch Po may be up to λ/2NA (object)=Pp2. As a result, considering that the measurement sensitivity is inversely proportional to the pitch P of the pattern, in the case of the metrology apparatus 1000 of the example embodiment using oblique illumination, the measurement sensitivity may be increased by 2 times.

Figure 6A:
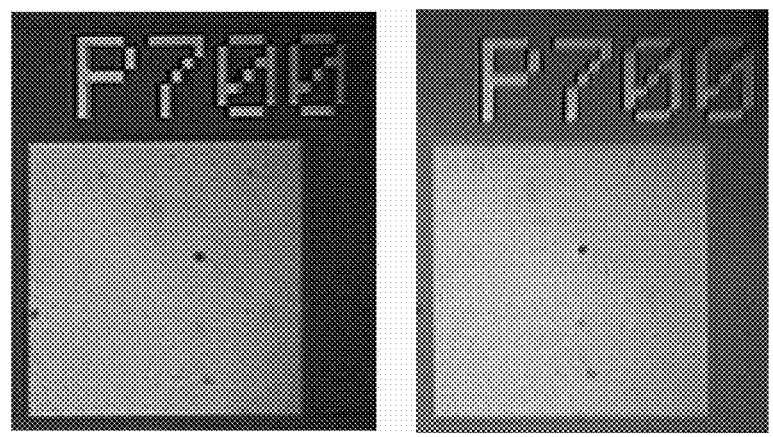
FIGS. 6A and 6B are a photograph and a graph showing improvement of resolution by use of oblique illumination.
Figure 6B:
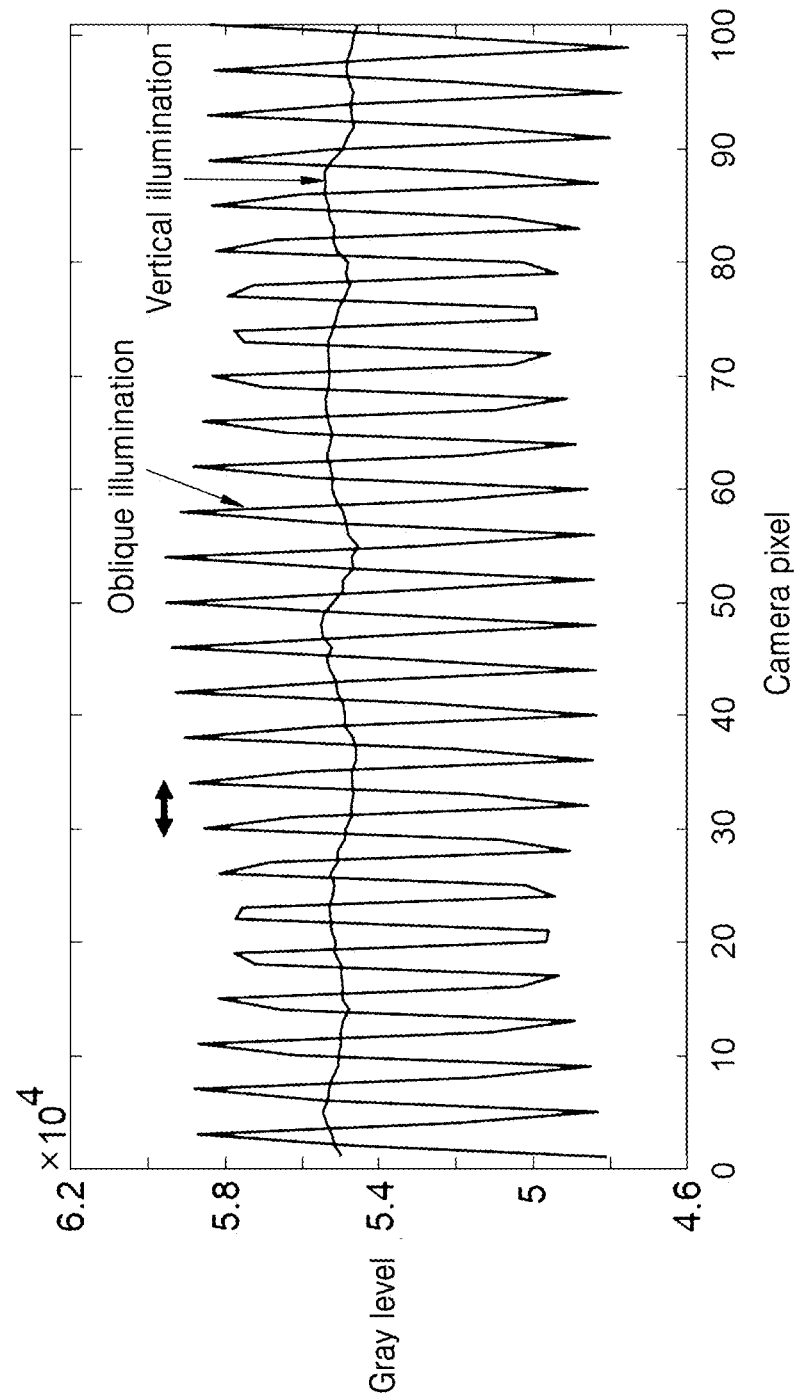

FIGS. 6A and 6B are a photograph and a graph showing improvement of resolution by use of oblique illumination. In detail, FIG. 6A shows photographs of a 700 nm pitch pattern taken by using a light beam having a wavelength of 530 nm. For example, the left photograph is obtained through a related art metrology apparatus using vertical illumination, and the right photograph is obtained through a metrology apparatus using oblique illumination according to an example embodiment. FIG. 6B is a graph showing the intensity of photographs of FIG. 6A in gray levels.

Referring to FIG. 6A, in the left photograph, patterns do not appear. On the other hand, in the right photograph, horizontal stripes corresponding to a pattern appear. Therefore, it may be confirmed experimentally that the resolution of the metrology apparatus 1000 of the example embodiment using oblique illumination is higher than that of the related art metrology apparatus.

Referring to FIG. 6B, in the graph corresponding to the left photograph of FIG. 6A, similar gray levels appear in all pixels. Accordingly, it may be seen through the gray level graph that no pattern may be distinguished in the left photograph. On the other hand, in the graph corresponding to the right photograph of FIG. 6A, it may be seen that the gray level is repeated between a maximum value and a minimum value according to positions of pixels. As indicated by a small double arrow, the interval between peaks may correspond to the pitch of the pattern. Accordingly, it may be seen through the gray level graph that the pattern may be clearly distinguished in the right photograph.

Figure 7A:
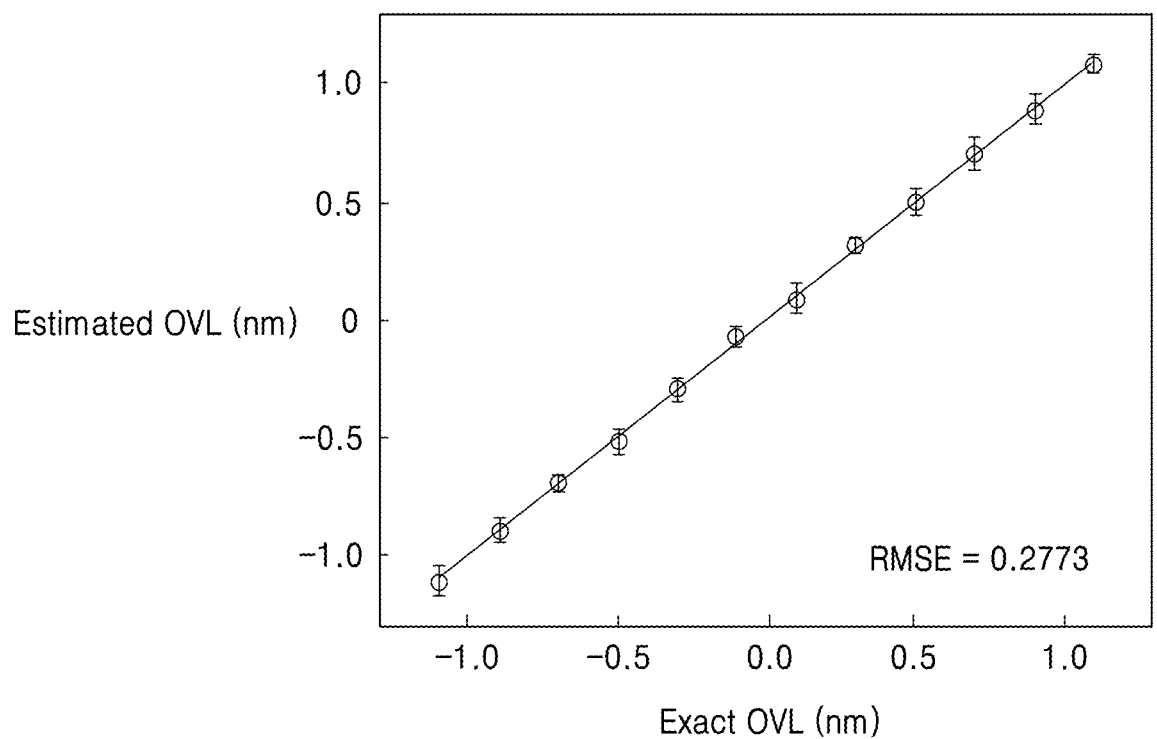
FIGS. 7A and 7B are graphs showing improvement of the consistency of measurement for overlay errors by the use of oblique illumination.
Figure 7B:
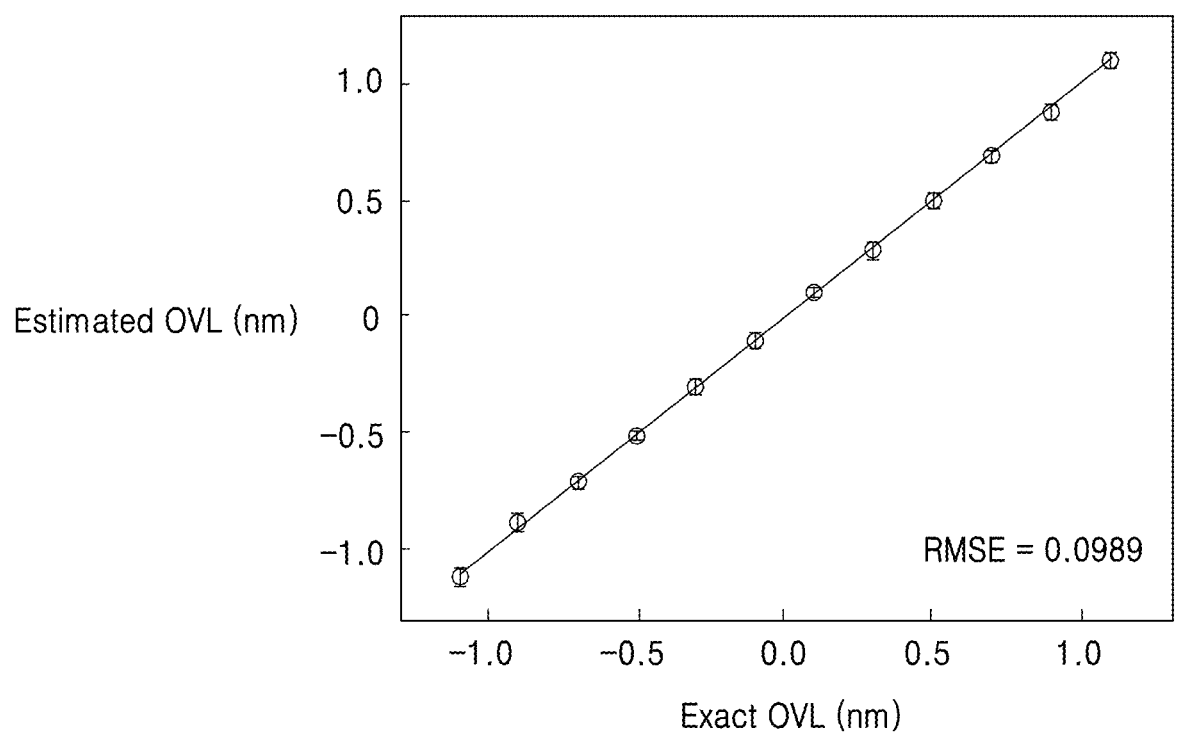

FIGS. 7A and 7B are graphs showing improvement of consistency of measurement of overlay errors by the use of oblique illumination. FIG. 7A shows consistency of measurement of overlay errors when vertical illumination is used, and FIG. 7B shows consistency of measurement of overlay errors when oblique illumination is used. The x-axis represents actual overlay errors, and the y-axis represents overlay errors by simulation.

Referring to FIGS. 7A and 7B, the consistency of measurement for overlay errors may be determined by calculating a root mean square error (RMSE). Here, a RMSE may refer to a value obtained by squaring the difference between actual overlay errors and overlay errors by simulation to obtain an average and taking the root of the average. When vertical illumination is used, the RMSE may be calculated as about 0.2773. When oblique illumination is used, the RMSE may be calculated as about 0.0989. Therefore, FIGS. 7A and 7B illustrate that, when oblique illumination is used, it is possible to improve the consistency of measurement for overlay errors by about 3 times as compared to a case of using vertical illumination.

Figure 8A:
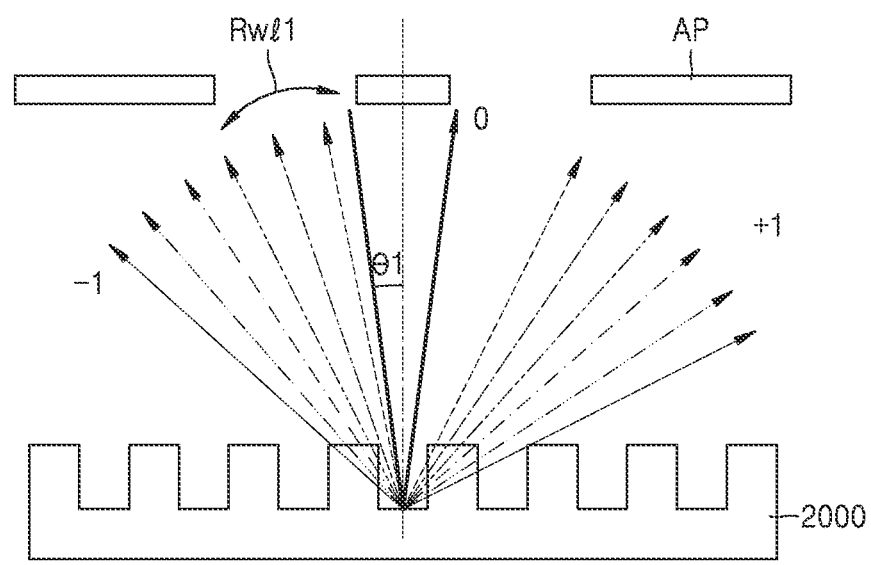
FIGS. 8A and 8B are conceptual diagrams for describing the concept of extension of a usable wavelength range based on adjustment of an inclination angle of oblique illumination.
Figure 8B:
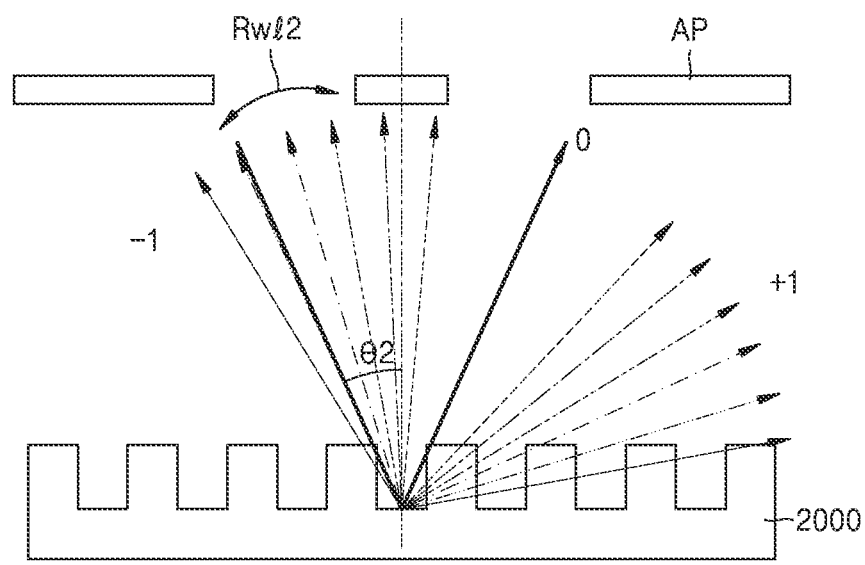

FIGS. 8A and 8B are conceptual diagrams for describing the concept of extension of a usable wavelength range based on adjustment of an inclination angle of oblique illumination. Descriptions of FIGS. 8A and 8B will be given below with reference to FIG. 1, and descriptions already given above with reference to FIGS. 1, 2A-2C, 3, 4A-4B, 5A-5B, 6A-6B and 7A-7B will be briefly given or omitted.

Referring to FIGS. 8A and 8B, and as discussed above, light beams in various wavelength ranges may be needed according to different processes. Also, it is possible to change or expand the wavelength range of usable light beams by controlling an inclination angle. In detail, as shown in FIG. 8A, when an incident angle to the metrology object 2000 is a relatively small first inclination angle θ1, light beams of a first wavelength range Rwl1 may be used as indicated by both end arrows of a curve, and light beams outside the first wavelength range Rwl1 may not be used due to excessive diffraction angles of diffracted light beams. For example, in the case of visible rays, at the first inclination angle θ1, a green light beam, a blue light beam, and a violet light beam of short wavelengths may be used for measurement because diffraction angles of first-order light beams are small. However, a yellow light beam, an orange light beam, and a red light beam of long wavelengths may not be used for measurement due to large diffraction angles of first-order light beams.

On the other hand, as shown in FIG. 8B, when the incidence angle is a relatively large inclination angle θ2, light beams of a second wavelength range Rwl2 may be used as indicated by a curved arrow, and light beams outside the second wavelength range Rwl2 may not be used due to excessive or insufficient diffraction angles of diffracted light beams. For example, in the case of visible rays, at the second inclination angle θ2, an orange light beam, a yellow light beam, and a green light beam of intermediate wavelengths may be used for measurement because diffraction angles of first-order light beams are suitable. However, a red light beam with very long wavelength or a blue light beam and a violet light beam with very short wavelengths may not be used for measurement due to excessive or insufficient diffraction angles of first-order light beams.

Therefore, by adjusting the inclination angle, it is possible to change or expand the wavelength range of a light beam that may be used for measurement. For reference, the movement of the wavelength range from FIG. 8A to FIG. 8B above may correspond to a change of the wavelength range. However, depending on the structure of the reflective object lens 320, the wavelength range may be moved to additionally use a light beam of a long wavelength while using light beams of short wavelengths like a blue light beam or a purple light beam as they are. In such a case, the movement of the wavelength range may correspond to expansion of the wavelength range.

Figure 9A:
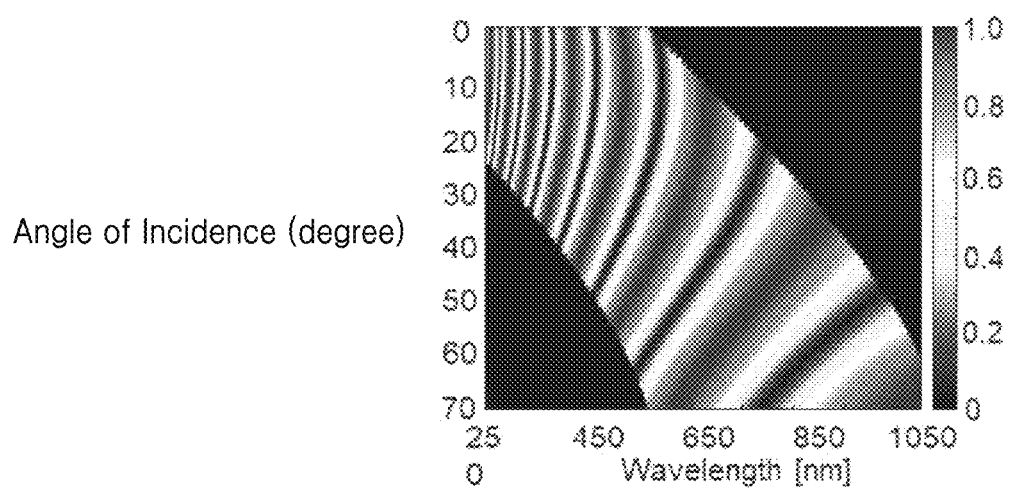
FIG. 9A is a graph of a measurement sensitivity map according to inclination angles and wavelengths of oblique illumination.
Figure 9B:
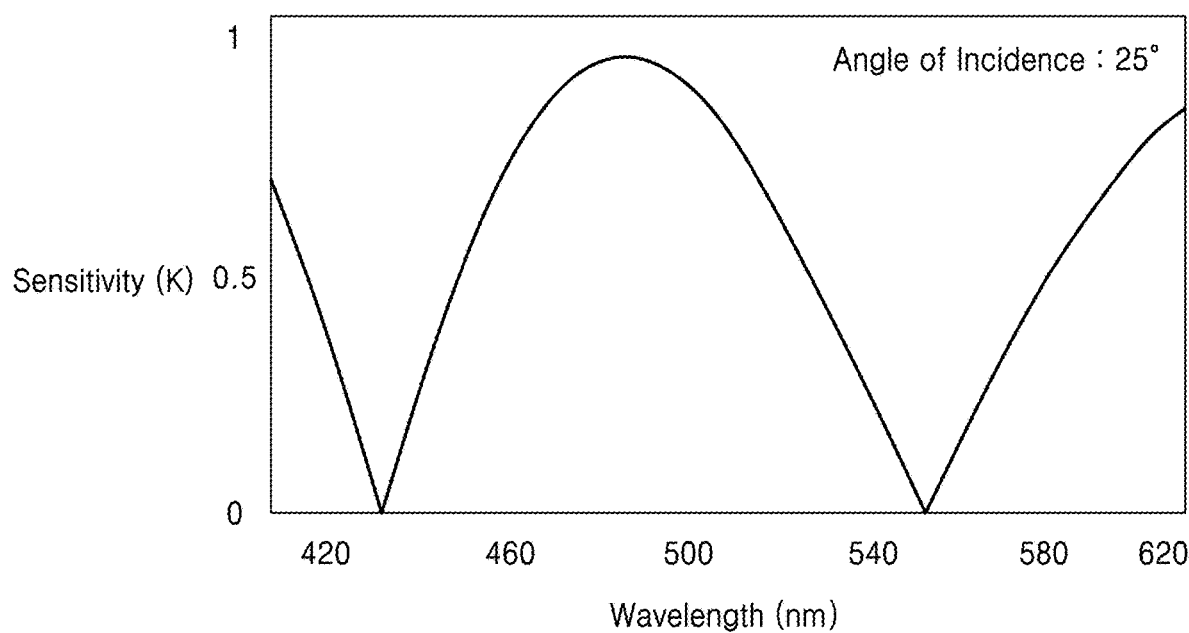
FIG. 9B is a graph of sensitivity according to wavelengths at an inclination angle of 25°.
Figure 9C:
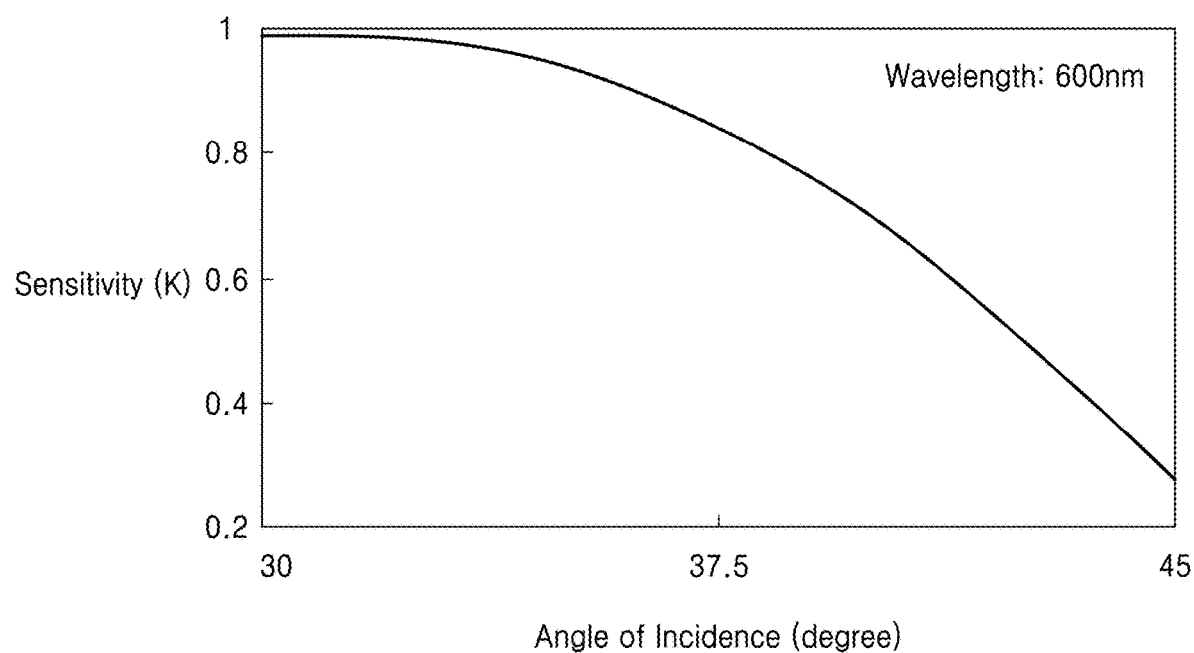
FIG. 9C is a graph of sensitivity according to inclination angles at a wavelength of 600 nm, respectively.

FIG. 9A is a graph of a measurement sensitivity map according to inclination angles and wavelengths of oblique illumination, FIG. 9B is a graph of sensitivity according to wavelengths at an inclination angle of 25°, and FIG. 9C is a graph of sensitivity according to inclination angles at a wavelength of 600 nm, respectively. In FIG. 9A, the x-axis represents wavelengths of light beams and the unit is nm. The left side of the y-axis represents inclination angles and the unit is degrees. The right side of the y-axis represents absolute values of measurement sensitivity K and there is no unit. Descriptions of FIGS. 9A to 9C will be given below with reference to FIG. 1, and descriptions already given above with reference to FIGS. 1, 2A-2C, 3, 4A-4B, 5A-5B, 6A-6B, 7A-7B, 8A and 8B will be briefly given or omitted. For reference, in FIG. 9A to 9C, Angle of Incident or AOI may refer to an inclination angle.

Referring to FIGS. 9A to 9C, the sensitivity map of FIG. 9A shows a measurable region and an unmeasurable region according to wavelengths 2 and inclination angles θ of light beams. For example, the center region of the diagonal region from the upper-left portion corresponding to the inclination angle θ of 0° to the lower-right portion corresponding to the wavelength λ of 1050 nm may correspond to a measurable region, whereas the lower-left portion and the upper-right portion outside the measurable region may correspond to unmeasurable regions.

As may be seen from the contrast for the measurement sensitivity K in the sensitivity map, in the case of the measurable region, the maximum measurement sensitivity K may be obtained by appropriately selecting a wavelength λ and an inclination angle θ of a light beam. Also, in the case of an unmeasurable region, measurement may not be possible even by using any inclination angle θ or any wavelength λ of a light beam within the range indicated in the sensitivity map.

Meanwhile, the measurement sensitivity K may depend on both the inclination angle θ and the wavelength λ of a light beam, as described in the proportional equation (1) above. Therefore, to secure an optimum measurement sensitivity K, an appropriate wavelength λ and an appropriate inclination angle θ of a light beam need to be selected. For example, as shown in FIG. 9B, when the inclination angle θ is fixed at 25°, the measurement sensitivity K varies from 0 to almost 1 depending on the wavelength λ of a light beam, and thus, by selecting an appropriate wavelength λ of the light beam, e.g., a wavelength around 500 nm, the measurement sensitivity K may be maximized. Also, as shown in FIG. 9C, when the wavelength λ of a light beam is fixed at 600 nm, the measurement sensitivity K varies from 1 to almost 0.3 according to an inclination angle θ in the range from 30° to 45°, and thus, by selecting an appropriate inclination angle θ, e.g., an inclination angle around 30°, the measurement sensitivity K may be maximized.

In the case of a related art vertically incident metrology apparatus, when the measurement sensitivity is low for a wavelength used for measurement, there is no way to enhance the measurement sensitivity. However, the metrology apparatus 1000 of the example embodiments of the inventive concept may improve the measurement sensitivity for a corresponding wavelength by adjusting an inclination angle as shown in FIG. 9C. Furthermore, the metrology apparatus 1000 according to the example embodiment may even select a wavelength by using the broadband light source 100, thereby further improving the measurement sensitivity.

Figure 10:
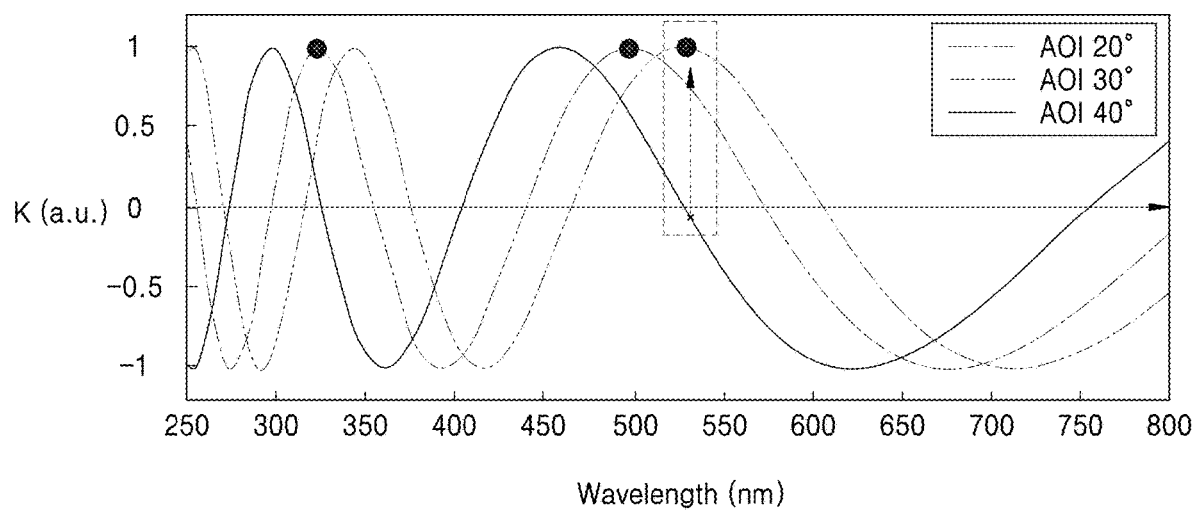
FIG. 10 is a graph for describing the concept of maximizing the sensitivity for each wavelength by adjusting an inclination angle of oblique illumination.

FIG. 10 is a graph for describing the concept of maximizing the sensitivity for each wavelength by adjusting an inclination angle of oblique illumination. The x-axis represents wavelengths of light beams and the unit is nm. The y-axis represents the measurement sensitivity K and the unit may be an arbitrary unit. Descriptions of FIG. 10 will be given below with reference to FIG. 1, and descriptions already given above with reference to FIGS. 1, 2A-2C, 3, 4A-4B, 5A-5B, 6A-6B, 7A-7B, 8A, 8B and 9A-9C will be briefly given or omitted.

Referring to FIG. 10, the graph shows the measurement sensitivity K according to wavelengths 2 of light beams at three inclination angles θ, e.g., 20°, 30°, and 40°. It may be seen that, for all three inclination angles θ, the measurement sensitivity K varies between −1 and 1 depending on the wavelengths λ of light beams. Meanwhile, for each of the three inclination angles θ, a portion corresponding to the maximum measurement sensitivity K is indicated by a small circle.

When the wavelength λ of a light beam is 530 nm and the inclination angle θ is 40°, as may be seen from the graph in FIG. 10, the measurement sensitivity K may be low measurement sensitivity near zero. At this time, when the inclination angle θ is changed to 20°, the measurement sensitivity K may be maximized, as indicated by an arrow in a dashed rectangle. In other words, it may be seen that, in the metrology apparatus 1000 of the example embodiment, by adjusting the inclination angle θ, the measurement sensitivity may be maximized for an arbitrary wavelength of a light beam.

Meanwhile, as compared to the case where the inclination angle θ is fixed, the measurement sensitivity K may be improved by about 1.5 times through the adjustment of the inclination angle θ. In detail, when the inclination angle θ is fixed, the effective value of sin φ is about $1/2^{1/2}$, and thus, based on the proportional equation (1), the measurement sensitivity K may be expressed as $1/(P*2^{1/2})$, for example. Meanwhile, when the inclination angle θ is adjusted, sin φ may have the maximum value of 1. Therefore, based on the proportional equation (1), the measurement sensitivity K may be 1/P, for example. In other words, as compared to the case where the inclination angle θ is fixed, the measurement sensitivity K may be increased by $2^{1/2} \cong 1.4$ times through the adjustment of the inclination angle θ. Meanwhile, as compared with a related art metrology apparatus to which a light beam is vertically incident, the measurement sensitivity K of the metrology apparatus 1000 according to the example embodiment may be increased by about 3 times total, that is, 2 times by oblique illumination and by 1.4 times by adjusting the inclination angle θ.

Figure 11A:
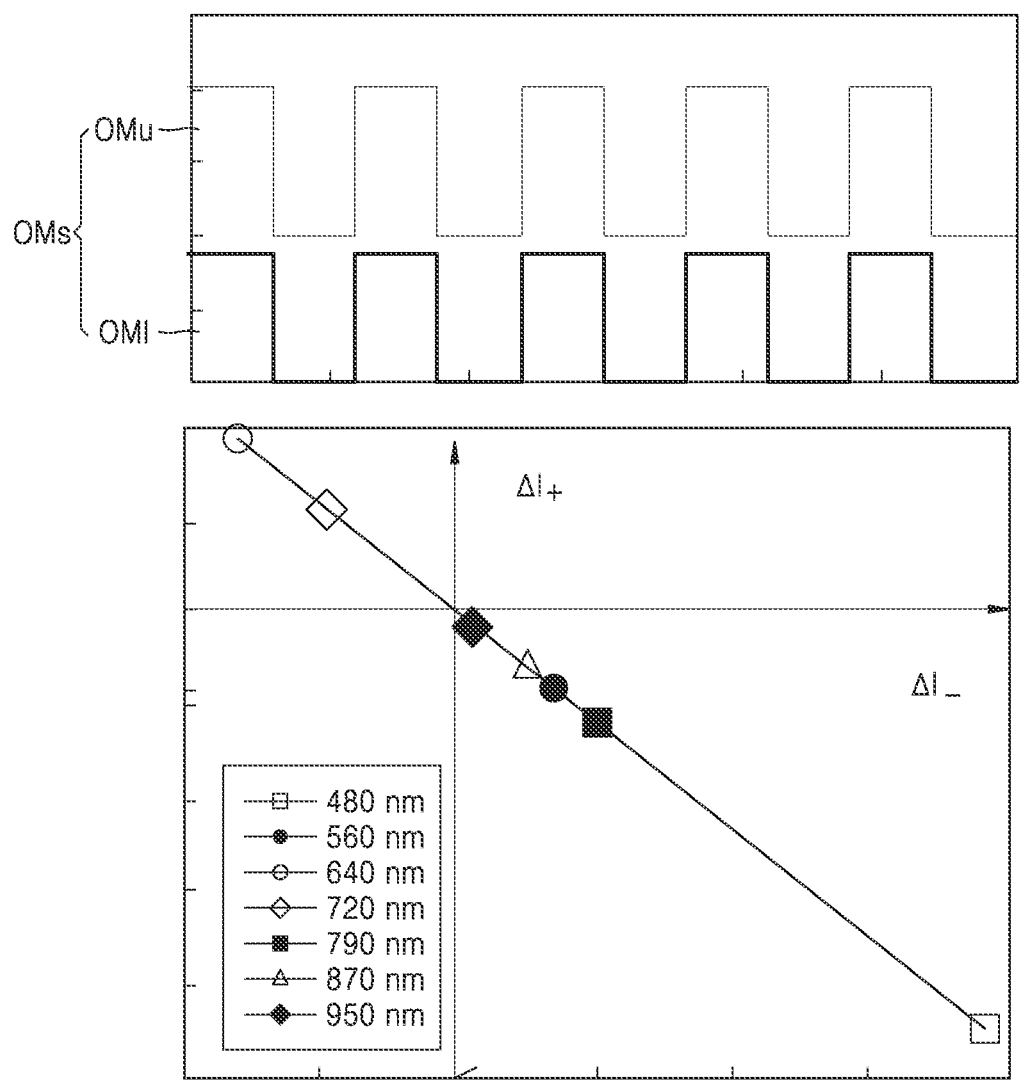
FIGS. 11A and 11B are conceptual diagrams for describing the concept of determining asymmetry of an overlay mark by checking linearity and non-linearity of an overlay error curve.
Figure 11B:
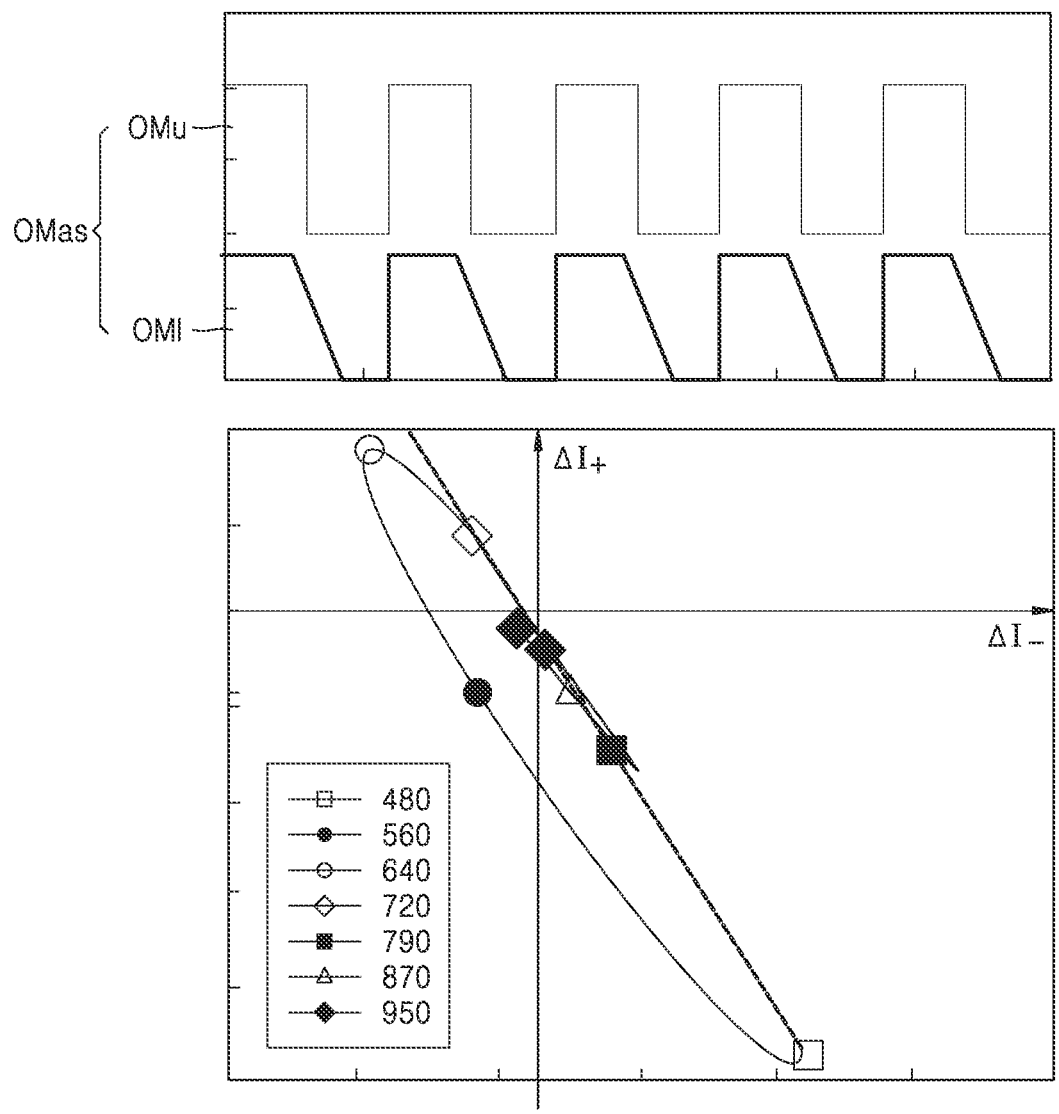
Figure 12:
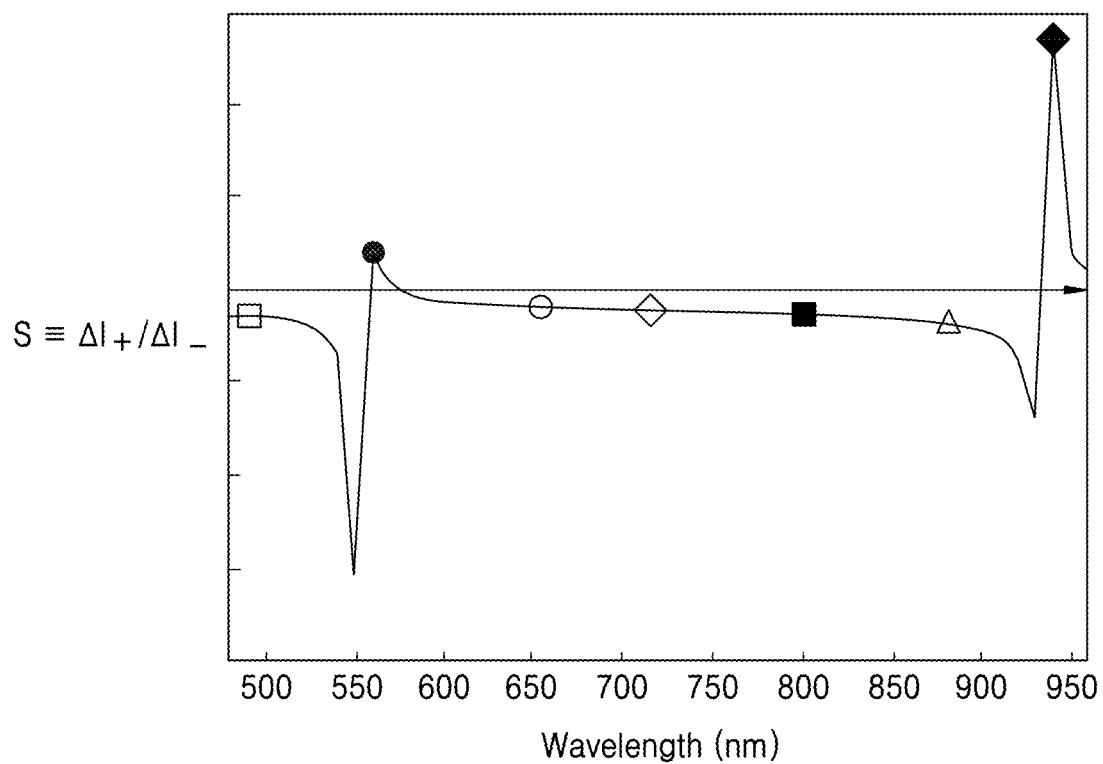
FIG. 12 is a graph showing a sensitivity slope for each wavelength.
Figure 13:
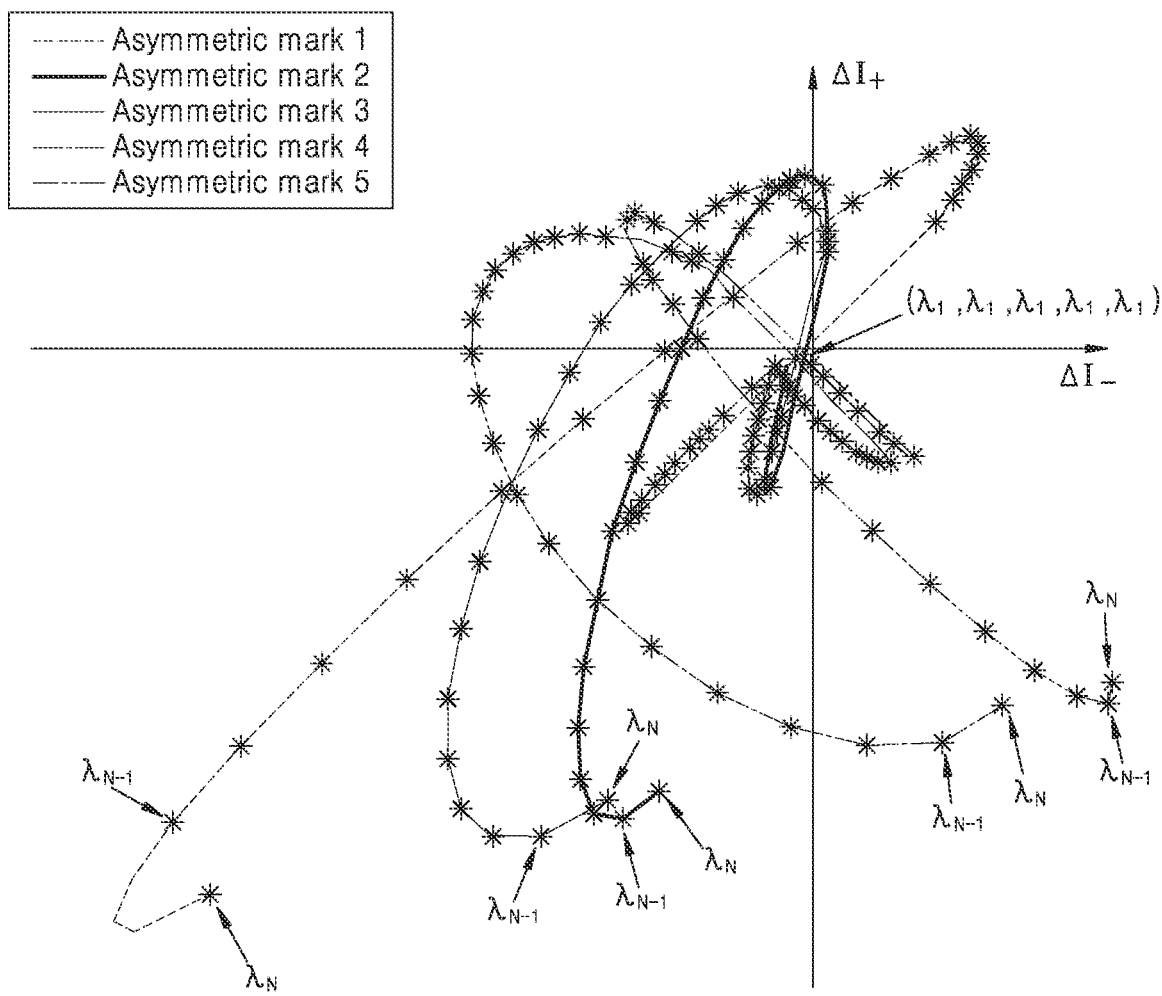
FIG. 13 is a graph showing non-linear overlay error curves at various overlay marks.

FIGS. 11A and 11B are conceptual diagrams for describing the concept of determining asymmetry of an overlay mark by checking linearity and non-linearity of an overlay error curve, FIG. 12 is a graph showing a sensitivity slope for each wavelength, and FIG. 13 is a graph showing non-linear overlay error curves at various overlay marks. In each of lower graphs of FIGS. 11A and 11B, the x-axis represents ΔI–, the y-axis represents ΔI+, and units thereof are arbitrary units. Descriptions of FIGS. 11A and 11B will be given below with reference to FIG. 1, and descriptions already given above with reference to FIGS. 1, 2A-2C, 3, 4A-4B, 5A-5B, 6A-6B, 7A-7B, 8A, 8B, 9A-9C and 10 will be briefly given or omitted.

Referring to FIGS. 11A and 11B, first, a measurement sensitivity ΔI for an overlay error may be defined as a difference between an intensity of a positive first-order light beam and an intensity of a negative first-order light beam of a diffracted light beam. Meanwhile, the measurement sensitivity ΔI may be divided into left bias sensitivity ΔI_ and right bias sensitivity ΔI+ according to application of a bias to an overlay mark. In other words, the left bias sensitivity ΔI_ may refer to the measurement sensitivity for an overlay mark to which a bias is applied to the left, and the right bias sensitivity ΔI+ may refer to the measurement sensitivity for an overlay mark to which a bias is applied to the right. According to an example embodiment, the left bias sensitivity ΔI_ and the right bias sensitivity ΔI+ may be opposite to each other. Meanwhile, an overlay error curve may be defined as a graph of the right bias sensitivity ΔI+ with respect to the left bias sensitivity ΔI_ according to wavelengths.

As may be seen through FIG. 11A, in the case of an overlay mark OMs in which a lower overlay mark OMl and an upper overlay mark OMu are symmetrical to each other, an overlay curve according to wavelengths may be linear. Here, being symmetric to each other may indicate that the shape of the lower overlay mark OMl is substantially identical to that of the upper overlay mark OMu rather than being symmetrical around a certain axis or point. Meanwhile, when an overlay curve is linear, sensitivity slopes S of all wavelengths may be the same. Here, the sensitivity slope S may refer to a ratio between the right bias sensitivity ΔI+ to the left bias sensitivity ΔI_, that is, ΔI+/ΔI_. In other words, when the sensitivity slopes S of all wavelengths are the same, an overlay curve according to wavelengths exhibits linearity. On the contrary, when the sensitivity slopes S of wavelengths are different from one another, an overlay curve according to wavelengths may exhibit non-linearity.

Meanwhile, in the case of an overlay mark OMas in which a lower overlay mark OMla and an upper overlay mark OMu are asymmetrical to each other, an overlay curve according to wavelengths may be non-linear. Here, being asymmetric to each other may include various cases including a case in which the shape of the lower overlay mark OMla is different from that of the upper overlay mark OMu as shown in FIG. 11B, a case in which a distance between a lower overlay mark and an upper overlay mark varies depending on positions, a case in which a lower overlay mark and an upper overlay mark include different materials, a case in which a lower overlay mark and an upper overlay mark exhibit different pattern uniformity, etc. Such an asymmetry of an overlay mark may be caused by various causes during a process for forming the overlay mark. Therefore, when the magnitude of the asymmetry of an overlay mark is very high, it may be necessary to change process conditions for the overlay mark to eliminate the causes.

On the contrary, when a non-linear overlay curve appears during a measurement of an overlay error, it may be determined that there is asymmetry between a lower overlay mark and an upper overlay mark. For example, FIG. 13 shows non-linear overlay error curves in various overlay marks. In other words, it may be determined that the corresponding overlay marks have asymmetry based on the non-linear overlay error curves.

On the other hand, dashed straight lines in FIG. 11B show a case in which wrong fitting is performed based on the sensitivity slope S of some wavelengths. As such, when a small number of wavelengths are used, an overlay curve may be incorrectly determined as being linear even though the overlay curve is actually non-linear. Therefore, by measuring an overlay error without recognizing the asymmetry of an overlay mark, a serious error may occur in an actually extracted overlay error value. For reference, a measured overlay error value is the sum of an actual overlay error value and an overlay error value due to a bias, and only actual overlay error value may be extracted through analysis of measured overlay error values.

In the case of the metrology apparatus 1000 of the example embodiment, by using the broadband light source 100, light beams of multiple wavelengths may be used to measure an overlay error. Therefore, the non-linearity of an overlay curve may be accurately determined, and thus it is possible to determine whether an overlay mark is asymmetric in advance. As a result, the consistency of measurement for overlay errors may be significantly improved.

Meanwhile, as shown in FIG. 12, as the sensitivity slopes S are spectralized according to wavelengths and regression or machine learning is performed by using the corresponding spectrum, an overlay error may be calculated for an asymmetric overlay mark. For example, even for an asymmetric overlay mark, when the asymmetry is small, regression or machine learning may be performed without changing a process for the overlay mark, and an overlay error value for the asymmetric overlay mark may be calculated.

For example, in the case of regression, a multi linear regression (MLR) algorithm may be used, wherein the MLR algorithm may be expressed in the form of Equation (2) below.

$$\Sigma a_n S(\lambda_n) = (\text{measured overlay})n \qquad \text{Equation (2)}$$

Here, n represents the number of wavelengths, and $S(\lambda_n)$ refers to a true value of an overlay error according to a wavelength $(\lambda_n)$. In other words, Equation (2) has the form of a simultaneous equation including measurement of independent overlay errors for n wavelengths and a true value S of an overlay error, and an asymmetric overlay error value may be calculated for an arbitrary spectrum by using a coefficient an obtained through the simultaneous equation.

Figure 14A:
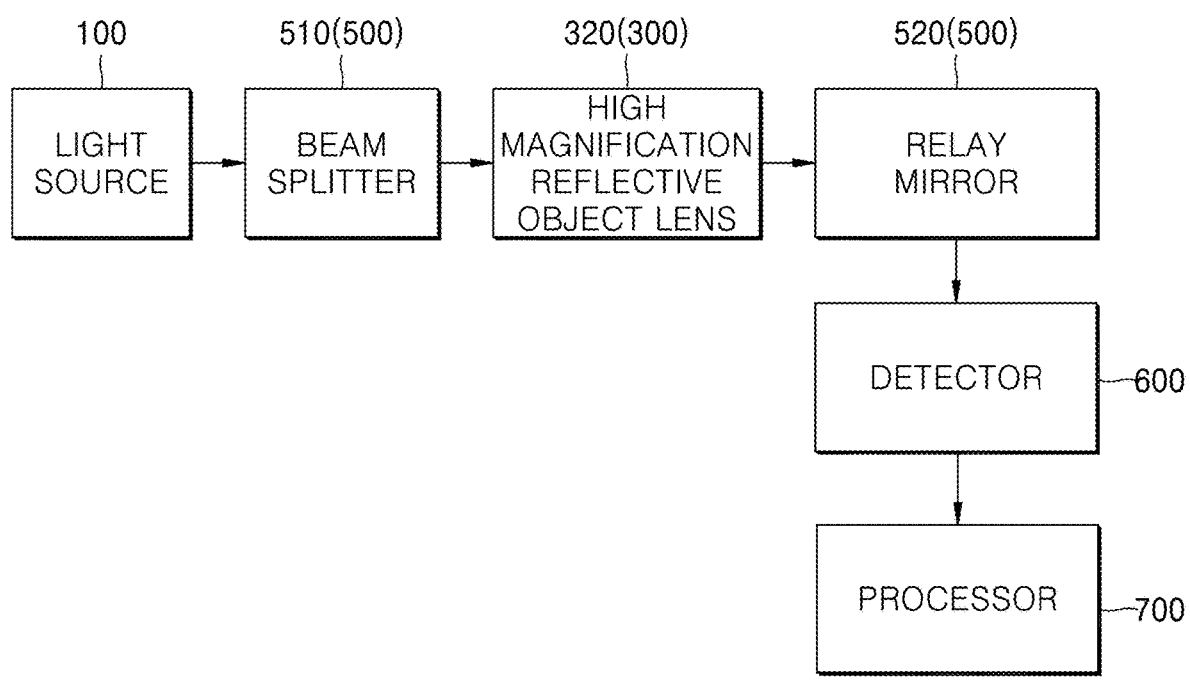
FIGS. 14A and 14B are block diagrams of diffraction-based metrology apparatuses using oblique illumination according to embodiments of the inventive concept.
Figure 14B:
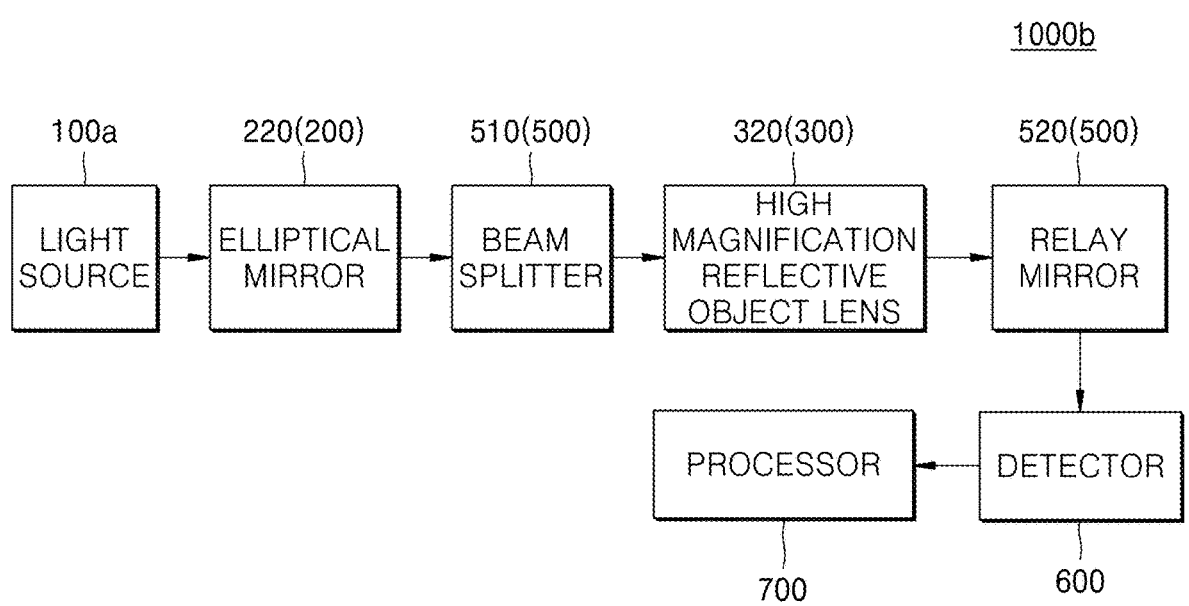

FIGS. 14A and 14B are block diagrams of diffraction-based metrology apparatuses using oblique illumination according to embodiments of the inventive concept. Descriptions of FIGS. 14A and 14B will be given below with reference to FIG. 1, and descriptions already given above with reference to FIGS. 1, 2A-2C, 3, 4A-4B, 5A-5B, 6A-6B, 7A-7B, 8A, 8B, 9A-9C, 10, 11A-11B, 12 and 13 will be briefly given or omitted.

Referring to FIG. 14A, a metrology apparatus 1000a according to another example embodiment may be different from the metrology apparatus 1000 of FIG. 1, in that, the metrology apparatus 1000a may not include an angle adjuster. In other words, the metrology apparatus 1000a according to the example embodiment has an oblique illumination structure in which light is obliquely incident on the metrology object 2000 without an angle adjuster. However, by omitting an angle adjuster for adjusting an inclination angle, the entire optical system may be simplified. Because the metrology apparatus 1000a according to the example embodiment does not include an angle adjuster, but still provides an oblique illumination structure in which light is obliquely incident on the metrology object 2000, the metrology apparatus 1000a may exhibit a measurement sensitivity that is twice as high as that of a related art metrology apparatus using vertical incidence.

Referring to FIG. 14B, a metrology apparatus 1000b according to another example embodiment may be different from the metrology apparatus 1000 of FIG. 1 in that a light source 100a is not a broadband light source. In detail, the metrology apparatus 1000b of the example embodiment has an oblique illumination structure in which light is obliquely incident on the metrology object 2000 and includes the angle adjuster 200 for adjusting an inclination angle, but the light source 100a may be a general light source having a short wavelength range instead of a broadband light source. Although the metrology apparatus 1000 of FIG. 1 may handle the characteristics of various metrology objects 2000. However, when the characteristics of the metrology object 2000 are known, an optical system may be simplified by using the light source 100a that outputs light beams of an appropriate wavelength range. For example, in the metrology apparatus 1000b of the example embodiment, a spectrometer like a monochromator for short wavelength scanning or a diffraction grating for spectroscopy may not be needed. Meanwhile, the metrology apparatus 1000b according to the example embodiment also uses oblique illumination and the angle adjuster 200, thereby significantly improving sensitivity as compared to a metrology apparatus using basic vertical illumination.

Figure 15:
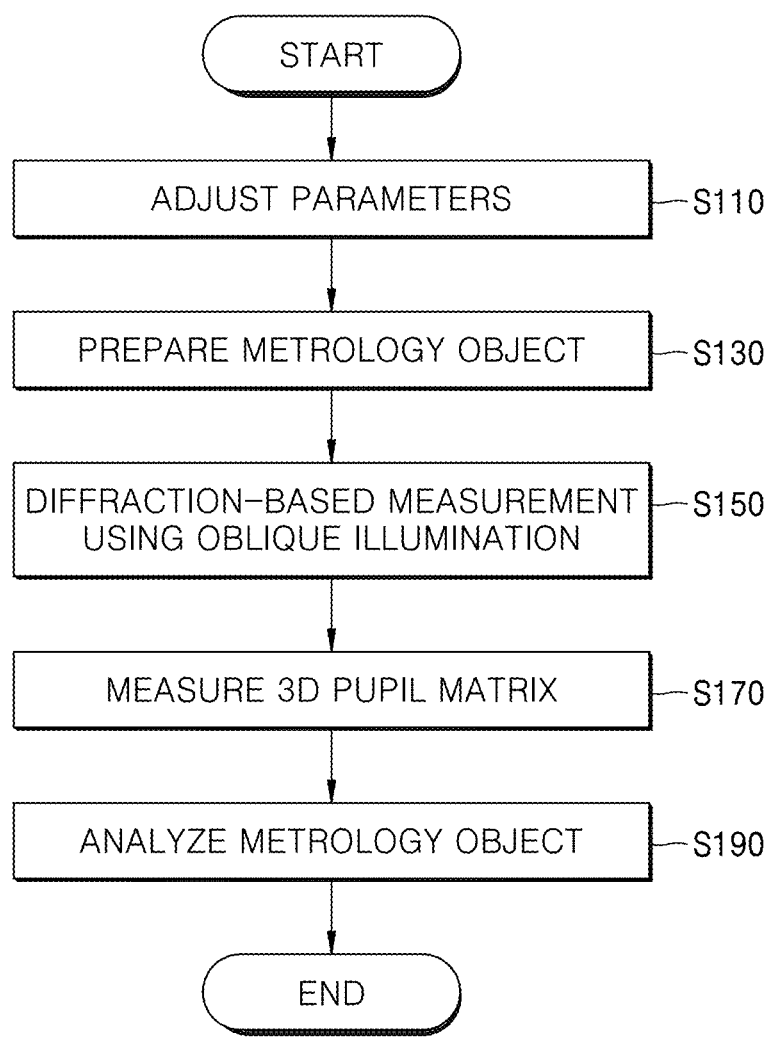
FIG. 15 is a schematic flowchart of a diffraction-based metrology method using oblique illumination according to an embodiment of the inventive concept.

FIG. 15 is a schematic flowchart of a diffraction-based metrology method using oblique illumination according to an example embodiment of the inventive concept. Descriptions of FIG. 15 will be given below with reference to FIG. 1, and descriptions already given above with reference to FIGS. 1 to 14B will be briefly given or omitted.

Referring to FIG. 15, in a diffraction-based metrology method using oblique illumination according to the example embodiment (hereinafter referred to simply as a 'metrology method'), parameters of the metrology apparatus 1000 are adjusted first (operation S110). For example, the wavelength range of the light source 100 may be set to be from about 250 nm to about 1,100 nm, the NA range may be set to be from about 0.4 to about 0.8, and the range of an inclination angle of illumination may be set to be from 23° to 53°. However, the wavelength range, the NA range, and the range of the inclination angle are not limited to the above-stated ranges, and as such, other ranges are possible according to other example embodiments.

Next, a metrology object is prepared (operation S130). The preparation of the metrology object refers to preparation of a device including a pattern or an overlay mark to be measured and may include a process for forming a pattern or an overlay mark on the corresponding device. Also, in the preparation of the metrology object (operation S130), it may be checked whether the pitch of a pattern or a usable wavelength range is appropriate for the metrology apparatus 1000 set above. For example, in relation to a usable wavelength range, the transparency of a material constituting the metrology object 2000 or the height of a layer may be checked. Also, in relation to the pitch of a pattern, a diffraction angle of a first-order light beam may be checked.

Thereafter, by using the metrology apparatus 1000, diffraction-based measurements using oblique illumination are sequentially performed on the metrology object 2000 (operation S150), a 3D pupil matrix is measured (operation S170), and the metrology object 2000 is analyzed (operation S190). Here, diffraction-based measurement may refer to detection of a pupil image through the detector 600. Meanwhile, the measurement of a 3D pupil matrix may be performed by the MU 720 of the processor 700, and the metrology object 2000 may be analyzed by the AU 740 of the processor 700. For reference, measurement refers to detection of a pupil image of the metrology object 2000 by the detector 600, and metrology is a term broader than the measurement and may include measurement, measurement of a 3D pupil matrix, and analysis. Meanwhile, the metrology object 2000 may be analyzed in various ways according to the purpose of a measurement for the metrology object 2000 as described above.

FIGS. 16A and 16B are flowcharts showing operations for diffraction-based measurement (S150) in the metrology method of FIG. 15 in more detail.

Referring to FIG. 16A, first, the light source 100 of the metrology apparatus 1000 generates and outputs a broadband light beam (operation S151). The broadband light beam may have a wavelength range from 180 nm to 20,000 nm, for example. However, the wavelength range of the broadband light beam is not limited to the above numerical range, and as such, other ranges are possible according to other example embodiments.

Next, the broadband light beam is incident on the metrology object 2000 at an acute inclination angle (operation S155). The incidence at an acute inclination angle may be achieved through the angle adjuster 200 of the metrology apparatus 1000 and the reflection optical system 300.

Thereafter, a diffracted light beam reflected and diffracted from the metrology object 2000 is detected on a pupil plane (operation S157). For example, the detector 600 of the metrology apparatus 1000 detects a pupil image for the diffracted light beam.

Referring to FIG. 16B, the metrology method of the example embodiment may be different from the metrology method of FIG. 16A, in that the method of FIG. 16B may further include selection of the wavelength of the broadband light source 100 and/or adjustment of the inclination angle (operation S153) between the generation and outputting of a broadband light beam (operation S151) and the incidence of the broadband light beam at an inclination angle (operation S155). The inclination angle may be adjusted by the angle adjuster 200 of the metrology apparatus 1000. Meanwhile, the selection of the wavelength of the light source 100 may be performed during diffraction-based measurement (operation 150*a*), but may also be performed in advance during the adjustment of the parameters (operation S110) of FIG. 15.

Figure 17A:
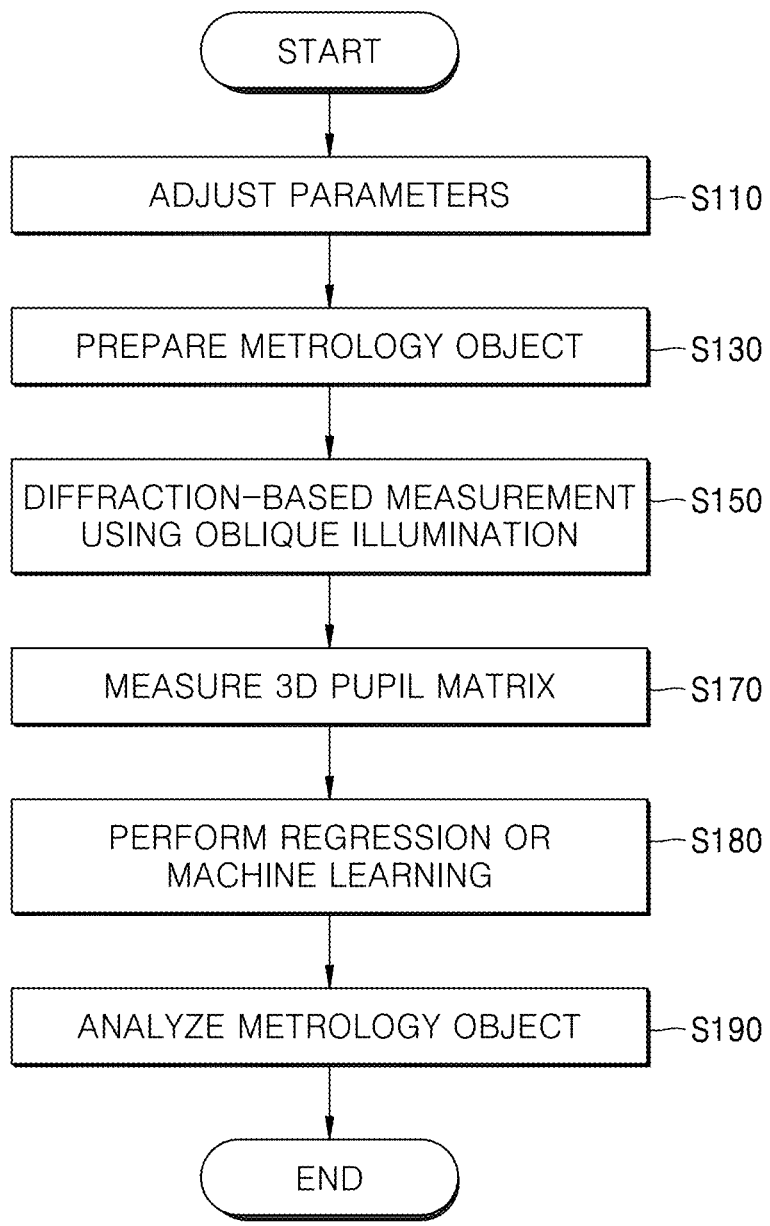
FIGS. 17A and 17B are schematic flowcharts of a diffraction-based metrology method using oblique illumination according to embodiments of the inventive concept.
Figure 17B:
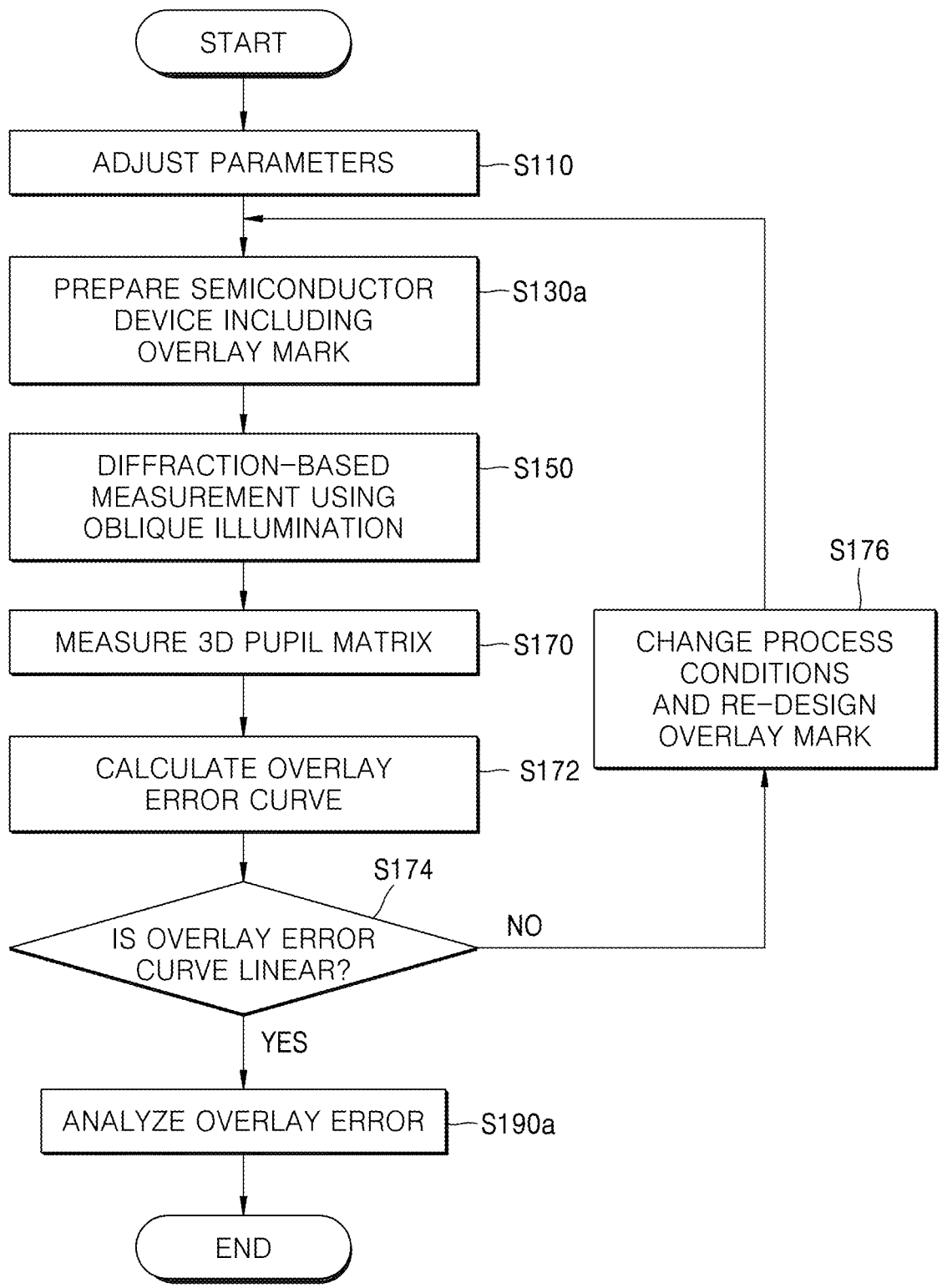

FIGS. 17A and 17B are schematic flowcharts of a diffraction-based metrology method using oblique illumination according to embodiments of the inventive concept. Descriptions of FIGS. 17A and 17B will be given below with reference to FIG. 1, and descriptions already given above with reference to FIGS. 14, 15, 16A and 16B will be briefly given or omitted.

Referring to FIG. 17A, the metrology method of the example embodiment may be different from the metrology method of FIG. 15, in that the method of FIG. 17B may further include performing regression or machine learning (operation S180) before the analysis of the metrology object 2000 (operation S190). The regression may use, for example, an MLR algorithm. However, the regression is not limited to the use of the MLR algorithm. In the metrology method of the example embodiment, a 3D pupil matrix may include a large amount of data due to the use of a broadband light beam and adjustment of an inclination angle. Also, regression or machine learning may be performed based on the large amount of data of the 3D pupil matrix. Therefore, in the analysis of the metrology object (operation S190), the metrology object 2000 may be more accurately analyzed based on the regression or machine learning.

Referring to FIG. 17B, in the metrology method of the example embodiment, operations are sequentially performed from the adjustment of the parameter (operation S110) to the measurement of a 3D pupil matrix (operation S170). The operations are the same as those described above in the metrology method of FIG. 15, except that a semiconductor device including an overlay mark is specified as a metrology object.

Thereafter, an overlay error curve is calculated (operation S172). As described above, the overlay error curve may be defined as a graph of the right bias sensitivity $\Delta l_+$ with respect to the left bias sensitivity $\Delta l_-$ according to wavelengths. After the overlay error curve is calculated, it is determined whether the overlay error curve is linear (operation S174). When the overlay error curve is linear (Yes), the method proceeds to operation S190*a* for analyzing an overlay error of a semiconductor device. Here, the linearity of the overlay error curve may be determined based on, for example, a determination coefficient $R^2$ in fitting to the overlay error curve. In detail, for example, when the determination coefficient $R^2$ is 0.95 or greater, it may be determined that the overlay error curve is linear. When the determination coefficient $R^2$ is less than 0.95, it may be determined that the overlay error curve is non-linear. However, the criterion for determining the linearity of the overlay error curve is not limited to the determination coefficient $R^2$. Meanwhile, the analysis of the overlay error may include, for example, determination of whether a semiconductor device is defective based on overlay error values.

When the overlay error curve is not linear (No), that is, when the overlay error curve is non-linear, process conditions for the overlay mark are changed and the overlay mark is re-designed (operation S176). After the overlay mark is re-designed, the method proceeds to operation S130*a* for preparing a semiconductor device. Meanwhile, according to some example embodiments, in relation to the linearity of the overlay error curve, a two-stage determination process may be performed. For example, in the determination of the linearity of the overlay error curve, even when it is determined as being non-linear, it may be determined again whether the non-linearity is large or small through set criteria. When the non-linearity is large, the method may proceed to operation S176 for re-designing the overlay mark. When the non-linearity is small, the method may proceed to operation S190*a* for analyzing an overlay error. Also, the metrology method of the example embodiment may further include performing regression and machine learning (operation S180) before the analysis of the overlay error (operation S190*a*), as shown in FIG. 17A.

Figure 18A:
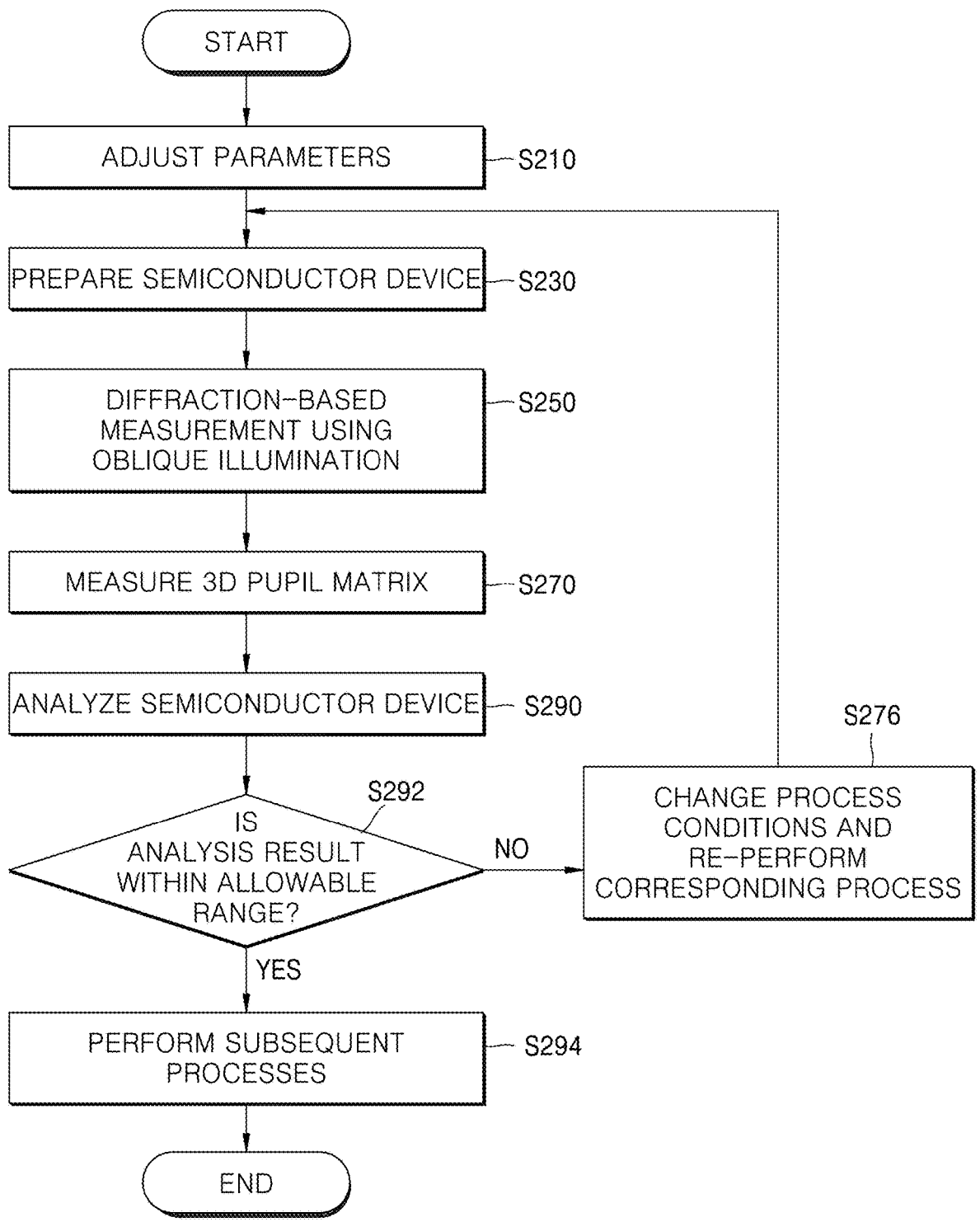
FIGS. 18A and 18B are schematic flowcharts of a method of manufacturing a semiconductor device using a diffraction-based metrology method according to embodiments of the inventive concept.
Figure 18B:
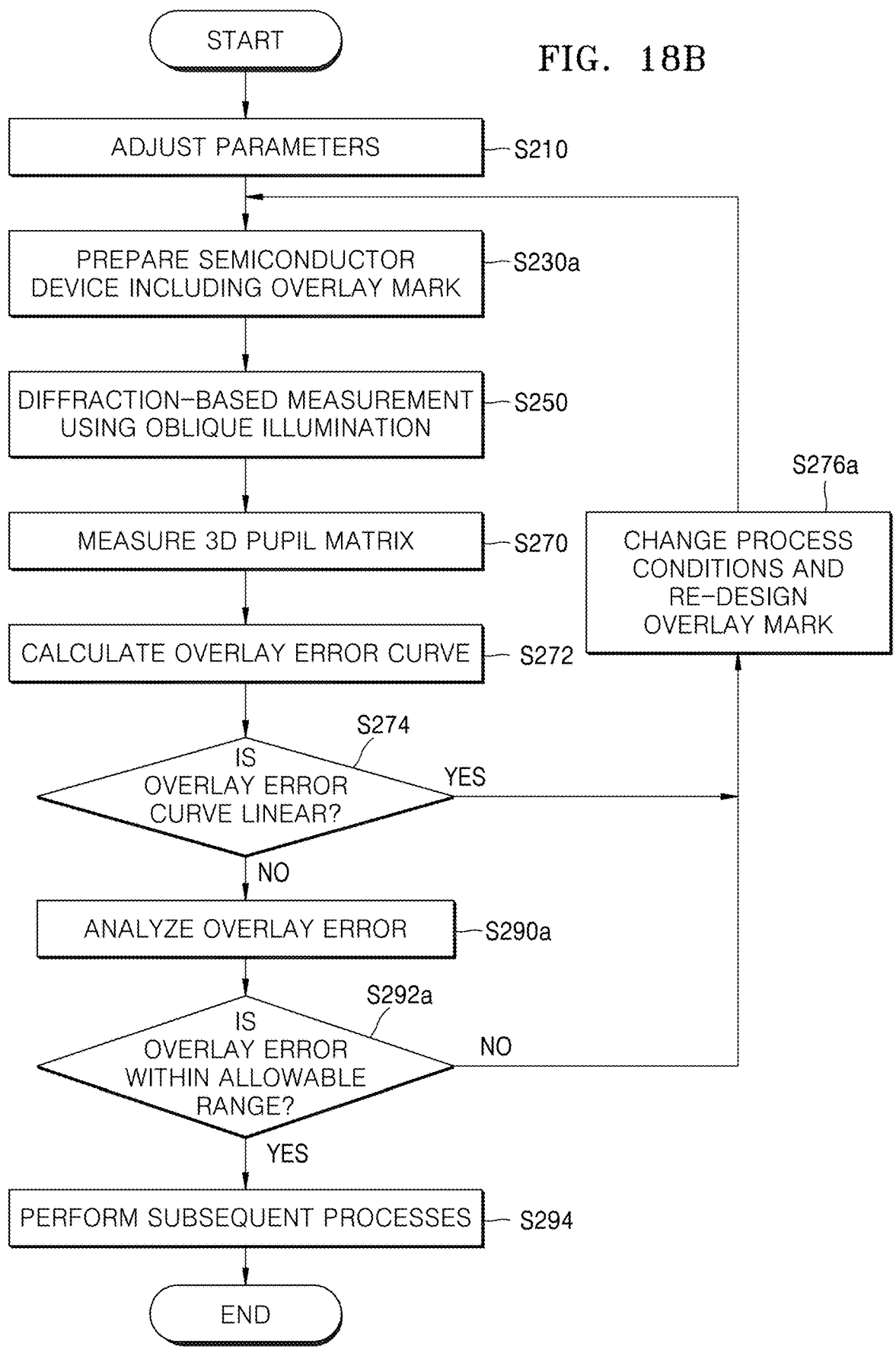

FIGS. 18A and 18B are schematic flowcharts of a method of manufacturing a semiconductor device using a diffraction-based metrology method according to example embodiments of the inventive concept. Descriptions of FIGS. 18A and 18B will be given below with reference to FIG. 1, and descriptions already given above with reference to FIGS. 14, 15, 16A-16B and 17-17B will be briefly given or omitted.

Referring to FIG. 18A, in a method of manufacturing a semiconductor device using a diffraction-based metrology method of the example embodiment (hereinafter referred to simply as a 'manufacturing method'), operations are sequentially performed from operation S210 for adjusting parameters to operation S290 for analyzing a semiconductor device. The operations are the same as those as described above in the metrology method of FIG. 15 or 17B.

Then, it is determined whether an analysis result is within an allowable range (operation S292). When the analysis result is within the allowable range (Yes), subsequent processes for the semiconductor device are performed (operation S294). For example, the subsequent processes for the semiconductor device may include a deposition process, an etching process, an ion process, a cleaning process, etc. Also, the subsequent processes for the semiconductor device may include a process for testing a semiconductor device at the wafer level. Furthermore, the subsequent processes for a semiconductor device may include a process for individualizing a wafer into semiconductor chips and a process of packaging the semiconductor chips.

When the analysis result is out of the allowable range (No), corresponding process conditions are changed and the process is re-performed (operation S276). The re-performance of the process may vary depending on the purpose of metrology for the metrology object 2000. For example, when the purpose of the metrology is an overlay error of the metrology object 2000, the re-performance of the process may refer to changing process conditions for an overlay mark and re-designing the overlay mark. Also, when the purpose of the metrology is a size of a pattern of the metrology object 2000 or a uniformity of the pattern, the re-performance of the process may refer to changing process conditions for pattern formation and re-forming the pattern. After the re-performance of the process, the method proceeds to operation S230 for preparing a semiconductor device.

Referring to FIG. 18B, operations are sequentially performed from operation S210 for adjusting parameters to operation S290*a* for analyzing an overlay error. The operations are the same as those as described above in the metrology method of FIG. 17B.

Then, it is determined whether an overlay error is within an allowable range (operation S292*a*). When the overlay error is within the allowable range (Yes), subsequent processes for the semiconductor device are performed (operation S294). When the overlay error is out of the allowable range (No), process conditions for an overlay mark are changed and the overlay mark is re-designed (operation S276*a*). The re-designing of the overlay mark (operation S276*a*) is the same as that described in the description of FIG. 17B. After the overlay mark is re-designed, the method proceeds to operation S230 for preparing a semiconductor device.

According to an example embodiment, the methods and/or operations illustrated in FIGS. 14, 15, 16A-16B, 17A-1B and 18A-18B may be performed by a processor. For instance, a processor may be configured to perform the operations of the metrology apparatus 1000.

At least one of the components, elements, modules or units (collectively "components" in this paragraph) represented by a block in the drawings, such as the measurement unit or the analysis unit, may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors. According to an example embodiment, the algorithms or computer programs may be stored in a memory or a storage device. Furthermore, the components represented by a block or processing steps may employ any number of related art techniques for electronics configuration, signal processing and/or control, data processing and the like.

While the inventive concept has been particularly shown and described with reference to embodiments thereof, it will be understood that various changes in form and details may be made therein without departing from the spirit and scope of the following claims.

What is claimed is:

1. An apparatus comprising:
a light source configured to output a light beam;
a stage on which an object is placed;
a reflective optical element configured to irradiate the light beam onto the object through reflection, such that the light beam is incident on the object at an inclination angle, the inclination angle being an acute angle;
a detector configured to detect a diffracted light beam that is based on the light beam reflected and diffracted by the object;
an angle adjuster; and
a processor configured to measure a 3D pupil matrix for the diffracted light beam and analyze the object based on the 3D pupil matrix,
wherein the reflective optical element comprises a magnification reflection type object lens, the magnification reflection type object lens comprising a first aspherical mirror having an opening at a center and a second aspherical mirror provided below the first aspherical mirror,
wherein the light beam passes through the opening of the first aspherical mirror from a first side of the first aspherical mirror, is reflected by the second aspherical mirror, is incident on a second side of the first aspherical mirror different from the first side of the first aspherical mirror, is reflected by the first aspherical mirror, and is incident on the object at the inclination angle, and
wherein the angle adjuster is further configured to adjust the inclination angle to expand a wavelength range of the light beam by changing a focusing position of the light beam on a pupil plane between the first aspherical mirror and the second aspherical mirror, such that sensitivity is maximized for a wavelength used the measurement of the 3D pupil matrix.

2. The apparatus of claim 1, wherein the light beam output by the light source is a broadband light beam within the wavelength range from 180 nm to 20,000 nm.

3. The apparatus of claim 2, wherein the light source is further configured to output the light beam while scanning the wavelength range with a short wavelength or output the light beam including an entirety of the wavelength range.

4. The apparatus of claim 1, wherein the angle adjuster comprises one of a mirror type, a wavefront adjustment type, or a translation type.

5. The apparatus of claim 1, wherein the detector is further configured to detect a pupil image, which is an image on the pupil plane.

6. The apparatus of claim 5, wherein the 3D pupil matrix comprises the wavelength of the light beam, the inclination angle, and intensity of the diffracted light beam on the pupil image as variables.

7. The apparatus of claim 1, wherein the processor is further configured to analyze the object by performing regression or machine learning, based on data of the 3D pupil matrix.

8. The apparatus of claim 1, wherein the processor is further configured to analyze at least one of an overlay error of the object, a size of a pattern, a thickness of the pattern, a uniformity of the pattern, or a defect.

9. The apparatus of claim 1, wherein the processor is further configured to analyze an overlay error of the object, and wherein the wavelength of the light beam is selected and the inclination angle is adjusted, such that measurement sensitivity for the overlay error is maximized.

10. The apparatus of claim 1, wherein the processor is further configured to analyze an overlay error of the object,
wherein measurement sensitivity for the overlay error is defined as a difference between intensity of a positive first-order light beam and a negative first-order light beam of the diffracted light beam,
wherein the measurement sensitivity comprises a left bias sensitivity in a case where a bias is applied to the left of an overlay mark and a right bias sensitivity in a case where the bias is applied to the right of the overlay mark, and when an overlay error curve is defined as a graph of the right bias sensitivity $\Delta 1_+$ with respect to the left bias sensitivity according to the wavelength, and
wherein the processor is further configured to determine whether the overlay mark is asymmetric by using the overlay error curve.

11. The apparatus of claim 10, wherein, when the overlay error curve is linear or the overlay error curve is non-linear and satisfies a set criteria, the processor is further configured to analyze the overlay error through regression or machine learning based on data of the 3D pupil matrix, and wherein when the overlay error curve is non-linear and does not satisfy the set criteria, processing conditions for the overlay mark are changed.

12. An apparatus comprising:
a light source configured to output a light beam;
a stage on which an object is placed;
a reflective optical element configured to irradiate the light beam onto the object through reflection, such that the light beam is incident on the object at an inclination angle, the inclination angle being an acute angle;
an angle adjuster configured to adjust the inclination angle;
a detector configured to detect a diffracted light beam based on the light beam reflected and diffracted by the object, wherein a pupil image, which is an image formed on a pupil plane of the diffracted light beam, is detected; and
a processor configured to measure a 3D pupil matrix for the diffracted light beam, which comprises a wavelength of the light beam, the inclination angle, and intensity of the diffracted light beam as variables, and analyze an overlay error of the object based on the 3D pupil matrix,
wherein the reflective optical element comprises a magnification reflection type object lens, the magnification reflection type object lens comprising a first aspherical mirror having an opening at a center and a second aspherical mirror provided below the first aspherical mirror,
wherein the light beam passes through the opening of the first aspherical mirror from a first side of the first aspherical mirror, is reflected by the second aspherical mirror, is incident on a second side of the first aspherical mirror different from the first side of the first aspherical mirror, is reflected by the first aspherical mirror, and is incident on the object at the inclination angle, and
wherein the angle adjuster is further configured to adjust the inclination angle to expand a wavelength range of the light beam by changing a focusing position of the light beam on a pupil plane between the first aspherical mirror and the second aspherical mirror, such that sensitivity is maximized for a wavelength used the measurement of the 3D pupil matrix.

13. The apparatus of claim 12, wherein the light beam output by the light source is a broadband light beam within the wavelength range from 180 nm to 20,000 nm, and the light source is further configured to output the light beam while scanning the wavelength range with a short wavelength or output the light beam including an entirety of the wavelength range.

14. The apparatus of claim 12,
wherein measurement sensitivity for the overlay error is defined as a difference between intensity of a positive first-order light beam and a negative first-order light beam of the diffracted light beam,
wherein the measurement sensitivity comprises a left bias sensitivity in a case where a bias is applied to the left of an overlay mark and a right bias sensitivity in a case where the bias is applied to the right of the overlay mark, and when an overlay error curve is defined as a graph of the right bias sensitivity with respect to the left bias sensitivity according to the wavelength, and
wherein the processor is further configured to determine whether the overlay mark is asymmetric by using the overlay error curve.

15. The apparatus of claim 14, wherein, when the overlay error curve is linear or the overlay error curve is non-linear and satisfies a set criteria, the processor is further configured to analyze the overlay error through regression or machine learning based on data of the 3D pupil matrix, and wherein when the overlay error curve is non-linear and does not satisfy the set criteria, processing conditions for the overlay mark are changed.

16. An apparatus comprising:
a memory storing one or more instructions; and
a processor configured to:
control a light source to output a light beam, the light beam being irradiated onto the object at an inclination angle through a reflective optical element comprising a magnification reflection type object lens, the magnification reflection type object lens comprising a first aspherical mirror having an opening at a center and a second aspherical mirror provided below the first aspherical mirror;
receive detected information corresponding to a diffracted light beam that is based on the light beam reflected and diffracted by an object;
measure a 3D pupil matrix for the diffracted light beam based on the detected information; and
analyze the object based on the 3D pupil matrix,
wherein the light beam passes through the opening of the first aspherical mirror from a first side of the first aspherical mirror, is reflected by the second aspherical mirror, is incident on a second side of the first aspherical mirror different from the first side of the first aspherical mirror, is reflected by the first aspherical mirror, and is incident on the object at the inclination angle, and
wherein the angle adjuster is further configured to adjust the inclination angle to expand a wavelength range of the light beam by changing a focusing position of the light beam on a pupil plane between the first aspherical mirror and the second aspherical mirror, such that sensitivity is maximized for a wavelength used the measurement of the 3D pupil matrix.

* * * * *